(12) United States Patent
Master et al.

(10) Patent No.: US 7,478,031 B2
(45) Date of Patent: *Jan. 13, 2009

(54) METHOD, SYSTEM AND PROGRAM FOR DEVELOPING AND SCHEDULING ADAPTIVE INTEGRATED CIRCUITY AND CORRESPONDING CONTROL OR CONFIGURATION INFORMATION

(75) Inventors: Paul L. Master, Sunnyvale, CA (US); Eugene Hogenauer, San Carlos, CA (US); Bicheng William Wu, Union City, CA (US); Dan MingLun Chuang, San Jose, CA (US); Bjorn Freeman-Benson, Seattle, WA (US)

(73) Assignee: QST Holdings, LLC, Palo Alto, CA (US)

( * ) Notice: Subject to any disclaimer, the term of this patent is extended or adjusted under 35 U.S.C. 154(b) by 816 days.

This patent is subject to a terminal disclaimer.

(21) Appl. No.: 10/289,639

(22) Filed: Nov. 7, 2002

(65) Prior Publication Data

US 2004/0093601 A1 May 13, 2004

(51) Int. Cl.
*G06F 9/45* (2006.01)
(52) U.S. Cl. .................... 703/22; 703/14; 717/159; 717/136; 713/100; 709/220; 712/28; 712/227
(58) Field of Classification Search ............ 703/13–15, 703/22; 717/119, 159, 160, 136; 713/100, 713/189; 709/220, 328; 375/148; 712/28, 712/29, 227
See application file for complete search history.

(56) References Cited

U.S. PATENT DOCUMENTS 3,409,175 A 11/1968 Byrne (Continued)

FOREIGN PATENT DOCUMENTS

DE 100 18 374 A1 10/2001

(Continued)

OTHER PUBLICATIONS

"Algorithm Analysis and Mapping Environment for Adaptive Computing Systems: Further Results", Pauer et al, Lockheed Martin technical paper, 1999.*

(Continued)

*Primary Examiner*—Paul L Rodriguez
*Assistant Examiner*—Kandasamy Thangavelu
(74) *Attorney, Agent, or Firm*—Marc S. Kaufman; Wayne Tang; Nixon Peabody LLP

(57) ABSTRACT

A method, system and program are provided for development of an adaptive computing integrated circuit and corresponding configuration information, in which the configuration information provides an operating mode to the adaptive computing integrated circuit. The exemplary system includes a scheduler, a memory, and a compiler. The scheduler is capable of scheduling a selected algorithm with a plurality of adaptive computing descriptive objects to produce a scheduled algorithm and a selected adaptive computing circuit version. The memory is utilized to store the plurality of adaptive computing descriptive objects and a plurality of adaptive computing circuit versions generated during the scheduling process. The selected adaptive computing circuit version is converted into a hardware description language, for fabrication into the adaptive computing integrated circuit. The compiler generates the configuration information, from the scheduled algorithm and the selected adaptive computing circuit version, for the performance of the algorithm by the adaptive computing integrated circuit. In the exemplary embodiments, multiple versions of configuration information may be generated, for different circuit versions, different feature sets, different operating conditions, and different operating modes.

71 Claims, 4 Drawing Sheets

U.S. PATENT DOCUMENTS

| | | |
|---|---|---|
| 3,666,143 A | 5/1972 | Weston |
| 3,938,639 A | 2/1976 | Birrell |
| 3,949,903 A | 4/1976 | Benasutti et al. |
| 3,960,298 A | 6/1976 | Birrell |
| 3,967,062 A | 6/1976 | Dobias |
| 3,991,911 A | 11/1976 | Shannon et al. |
| 3,995,441 A | 12/1976 | McMillin |
| 4,076,145 A | 2/1978 | Zygiel |
| 4,143,793 A | 3/1979 | McMillin et al. |
| 4,172,669 A | 10/1979 | Edelbach |
| 4,174,872 A | 11/1979 | Fessler |
| 4,181,242 A | 1/1980 | Zygiel |
| RE30,301 E | 6/1980 | Zygiel |
| 4,218,014 A | 8/1980 | Tracy |
| 4,222,972 A | 9/1980 | Caldwell |
| 4,237,536 A | 12/1980 | Enelow et al. |
| 4,252,253 A | 2/1981 | Shannon |
| 4,302,775 A | 11/1981 | Widergren et al. |
| 4,333,587 A | 6/1982 | Fessler et al. |
| 4,354,613 A | 10/1982 | Desai et al. |
| 4,377,246 A | 3/1983 | McMillin et al. |
| 4,393,468 A | 7/1983 | New |
| 4,413,752 A | 11/1983 | McMillin et al. |
| 4,458,584 A | 7/1984 | Annese et al. |
| 4,466,342 A | 8/1984 | Basile et al. |
| 4,475,448 A | 10/1984 | Shoaf et al. |
| 4,509,690 A | 4/1985 | Austin et al. |
| 4,520,950 A | 6/1985 | Jeans |
| 4,549,675 A | 10/1985 | Austin |
| 4,553,573 A | 11/1985 | McGarrah |
| 4,560,089 A | 12/1985 | McMillin et al. |
| 4,577,782 A | 3/1986 | Fessler |
| 4,578,799 A | 3/1986 | Scholl et al. |
| RE32,179 E | 6/1986 | Sedam et al. |
| 4,633,386 A | 12/1986 | Terepin |
| 4,658,988 A | 4/1987 | Hassell |
| 4,694,416 A | 9/1987 | Wheeler et al. |
| 4,711,374 A | 12/1987 | Gaunt et al. |
| 4,713,755 A | 12/1987 | Worley, Jr. et al. |
| 4,719,056 A | 1/1988 | Scott |
| 4,726,494 A | 2/1988 | Scott |
| 4,747,516 A | 5/1988 | Baker |
| 4,748,585 A | 5/1988 | Chiarulli et al. |
| 4,760,525 A | 7/1988 | Webb |
| 4,760,544 A | 7/1988 | Lamb |
| 4,765,513 A | 8/1988 | McMillin et al. |
| 4,766,548 A | 8/1988 | Cedrone et al. |
| 4,781,309 A | 11/1988 | Vogel |
| 4,800,492 A | 1/1989 | Johnson et al. |
| 4,811,214 A | 3/1989 | Nosenchuck et al. |
| 4,824,075 A | 4/1989 | Holzboog |
| 4,827,426 A | 5/1989 | Patton et al. |
| 4,850,269 A | 7/1989 | Hancock et al. |
| 4,856,684 A | 8/1989 | Gerstung |
| 4,901,887 A | 2/1990 | Burton |
| 4,921,315 A | 5/1990 | Metcalfe et al. |
| 4,930,666 A | 6/1990 | Rudick |
| 4,932,564 A | 6/1990 | Austin et al. |
| 4,936,488 A | 6/1990 | Austin |
| 4,937,019 A | 6/1990 | Scott |
| 4,960,261 A | 10/1990 | Scott et al. |
| 4,961,533 A | 10/1990 | Teller et al. |
| 4,967,340 A | 10/1990 | Dawes |
| 4,974,643 A | 12/1990 | Bennett et al. |
| 4,982,876 A | 1/1991 | Scott |
| 4,993,604 A | 2/1991 | Gaunt et al. |
| 5,007,560 A | 4/1991 | Sassak |
| 5,021,947 A | 6/1991 | Campbell et al. |
| 5,040,106 A | 8/1991 | Maag |
| 5,044,171 A | 9/1991 | Farkas |
| 5,090,015 A | 2/1992 | Dabbish et al. |
| 5,129,549 A | 7/1992 | Austin |
| 5,139,708 A | 8/1992 | Scott |
| 5,156,301 A | 10/1992 | Hassell et al. |
| 5,156,871 A | 10/1992 | Goulet et al. |
| 5,165,575 A | 11/1992 | Scott |
| 5,190,083 A | 3/1993 | Gupta et al. |
| 5,190,189 A | 3/1993 | Zimmer et al. |
| 5,193,151 A | 3/1993 | Jain |
| 5,193,718 A | 3/1993 | Hassell et al. |
| 5,202,993 A | 4/1993 | Tarsy et al. |
| 5,203,474 A | 4/1993 | Haynes |
| 5,240,144 A | 8/1993 | Feldman |
| 5,261,099 A | 11/1993 | Bigo et al. |
| 5,263,509 A | 11/1993 | Cherry et al. |
| 5,269,442 A | 12/1993 | Vogel |
| 5,280,711 A | 1/1994 | Motta et al. |
| 5,297,400 A | 3/1994 | Benton et al. |
| 5,301,100 A | 4/1994 | Wagner |
| 5,303,846 A | 4/1994 | Shannon |
| 5,335,276 A | 8/1994 | Thompson et al. |
| 5,339,428 A | 8/1994 | Burmeister et al. |
| 5,343,716 A | 9/1994 | Swanson et al. |
| 5,361,362 A | 11/1994 | Benkeser et al. |
| 5,368,198 A | 11/1994 | Goulet |
| 5,379,343 A | 1/1995 | Grube et al. |
| 5,381,546 A | 1/1995 | Servi et al. |
| 5,381,550 A | 1/1995 | Jourdenais et al. |
| 5,388,212 A | 2/1995 | Grube et al. |
| 5,392,960 A | 2/1995 | Kendt et al. |
| 5,437,395 A | 8/1995 | Bull et al. |
| 5,450,557 A | 9/1995 | Kopp et al. |
| 5,454,406 A | 10/1995 | Rejret et al. |
| 5,465,368 A | 11/1995 | Davidson et al. |
| 5,479,055 A | 12/1995 | Eccles |
| 5,490,165 A | 2/1996 | Blakeney, II et al. |
| 5,491,823 A | 2/1996 | Ruttenberg |
| 5,507,009 A | 4/1996 | Grube et al. |
| 5,515,519 A | 5/1996 | Yoshioka et al. |
| 5,517,600 A | 5/1996 | Shimokawa |
| 5,519,694 A | 5/1996 | Brewer et al. |
| 5,522,070 A | 5/1996 | Sumimoto |
| 5,530,964 A | 6/1996 | Alpert et al. |
| 5,534,796 A | 7/1996 | Edwards |
| 5,542,265 A | 8/1996 | Rutland |
| 5,553,755 A | 9/1996 | Bonewald et al. |
| 5,555,417 A | 9/1996 | Odnert et al. |
| 5,560,028 A | 9/1996 | Sachs et al. |
| 5,560,038 A | 9/1996 | Haddock |
| 5,570,587 A | 11/1996 | Kim |
| 5,572,572 A | 11/1996 | Kawan et al. |
| 5,590,353 A | 12/1996 | Sakakibara et al. |
| 5,594,657 A | 1/1997 | Cantone et al. |
| 5,600,810 A | 2/1997 | Ohkami |
| 5,600,844 A | 2/1997 | Shaw et al. |
| 5,602,833 A | 2/1997 | Zehavi |
| 5,603,043 A | 2/1997 | Taylor et al. |
| 5,607,083 A | 3/1997 | Vogel et al. |
| 5,608,643 A | 3/1997 | Wichter et al. |
| 5,611,867 A | 3/1997 | Cooper et al. |
| 5,623,545 A | 4/1997 | Childs et al. |
| 5,625,669 A | 4/1997 | McGregor et al. |
| 5,626,407 A | 5/1997 | Westcott |
| 5,630,206 A | 5/1997 | Urban et al. |
| 5,635,940 A | 6/1997 | Hickman et al. |
| 5,646,544 A | 7/1997 | Iadanza |
| 5,646,545 A | 7/1997 | Trimberger et al. |
| 5,647,512 A | 7/1997 | Assis Mascarenhas deOliveira et al. |
| 5,667,110 A | 9/1997 | McCann et al. |
| 5,684,793 A | 11/1997 | Kiema et al. |
| 5,684,980 A | 11/1997 | Casselman |
| 5,687,236 A | 11/1997 | Moskowitz et al. |
| 5,694,613 A | 12/1997 | Suzuki |

| Patent | Type | Date | Inventor |
|---|---|---|---|
| 5,694,794 | A | 12/1997 | Jerg et al. |
| 5,699,328 | A | 12/1997 | Ishizaki et al. |
| 5,701,482 | A | 12/1997 | Harrison et al. |
| 5,704,053 | A | 12/1997 | Santhanam |
| 5,706,191 | A | 1/1998 | Bassett et al. |
| 5,706,976 | A | 1/1998 | Purkey |
| 5,712,996 | A | 1/1998 | Schepers |
| 5,720,002 | A | 2/1998 | Wang |
| 5,721,693 | A | 2/1998 | Song |
| 5,721,854 | A | 2/1998 | Ebicioglu et al. |
| 5,732,563 | A | 3/1998 | Bethuy et al. |
| 5,734,808 | A | 3/1998 | Takeda |
| 5,737,631 | A | 4/1998 | Trimberger |
| 5,742,180 | A | 4/1998 | DeHon et al. |
| 5,742,821 | A | 4/1998 | Prasanna |
| 5,745,366 | A | 4/1998 | Highma et al. |
| RE35,780 | E | 5/1998 | Hassell et al. |
| 5,751,295 | A | 5/1998 | Becklund et al. |
| 5,754,227 | A | 5/1998 | Fukuoka |
| 5,758,261 | A | 5/1998 | Wiedeman |
| 5,768,561 | A | 6/1998 | Wise |
| 5,778,439 | A | 7/1998 | Trimberger et al. |
| 5,784,636 | A | 7/1998 | Rupp |
| 5,787,237 | A | 7/1998 | Reilly |
| 5,790,817 | A | 8/1998 | Asghar et al. |
| 5,791,517 | A | 8/1998 | Avital |
| 5,791,523 | A | 8/1998 | Oh |
| 5,794,062 | A | 8/1998 | Baxter |
| 5,794,067 | A | 8/1998 | Kadowaki |
| 5,802,055 | A | 9/1998 | Krein et al. |
| 5,818,603 | A | 10/1998 | Motoyama |
| 5,822,308 | A | 10/1998 | Weigand et al. |
| 5,822,313 | A | 10/1998 | Malek et al. |
| 5,822,360 | A | 10/1998 | Lee et al. |
| 5,828,858 | A | 10/1998 | Athanas et al. |
| 5,829,085 | A | 11/1998 | Jerg et al. |
| 5,835,753 | A | 11/1998 | Witt |
| 5,838,165 | A | 11/1998 | Chatter |
| 5,845,815 | A | 12/1998 | Vogel |
| 5,860,021 | A | 1/1999 | Klingman |
| 5,862,961 | A | 1/1999 | Motta et al. |
| 5,870,427 | A | 2/1999 | Tiedemann, Jr. et al. |
| 5,873,045 | A | 2/1999 | Lee et al. |
| 5,881,106 | A | 3/1999 | Cartier |
| 5,884,284 | A | 3/1999 | Peters et al. |
| 5,886,537 | A | 3/1999 | Macias et al. |
| 5,887,174 | A | 3/1999 | Simons et al. |
| 5,889,816 | A | 3/1999 | Agrawal et al. |
| 5,890,014 | A | 3/1999 | Long |
| 5,892,900 | A | 4/1999 | Ginter et al. |
| 5,892,961 | A | 4/1999 | Trimberger |
| 5,894,473 | A | 4/1999 | Dent |
| 5,901,884 | A | 5/1999 | Goulet et al. |
| 5,903,886 | A | 5/1999 | Heimlich et al. |
| 5,907,285 | A | 5/1999 | Toms et al. |
| 5,907,580 | A | 5/1999 | Cummings |
| 5,910,733 | A | 6/1999 | Bertolet et al. |
| 5,912,572 | A | 6/1999 | Graf, III |
| 5,913,172 | A | 6/1999 | McCabe et al. |
| 5,917,852 | A | 6/1999 | Butterfield et al. |
| 5,920,801 | A | 7/1999 | Thomas et al. |
| 5,931,918 | A | 8/1999 | Row et al. |
| 5,933,642 | A | 8/1999 | Greenbaum et al. |
| 5,940,438 | A | 8/1999 | Poon et al. |
| 5,949,415 | A | 9/1999 | Lin et al. |
| 5,950,011 | A | 9/1999 | Albrecht et al. |
| 5,950,131 | A | 9/1999 | Vilmur |
| 5,951,674 | A | 9/1999 | Moreno |
| 5,953,322 | A | 9/1999 | Kimball |
| 5,956,518 | A | 9/1999 | DeHon et al. |
| 5,956,967 | A | 9/1999 | Kim |
| 5,959,811 | A | 9/1999 | Richardson |
| 5,959,881 | A | 9/1999 | Trimberger et al. |
| 5,963,048 | A | 10/1999 | Harrison et al. |
| 5,966,534 | A | 10/1999 | Cooke et al. |
| 5,970,254 | A | 10/1999 | Cooke et al. |
| 5,987,105 | A | 11/1999 | Jenkins et al. |
| 5,987,611 | A | 11/1999 | Freund |
| 5,991,302 | A | 11/1999 | Berl et al. |
| 5,991,308 | A | 11/1999 | Fuhrmann et al. |
| 5,993,739 | A | 11/1999 | Lyon |
| 5,999,734 | A | 12/1999 | Willis et al. |
| 6,005,943 | A | 12/1999 | Cohen et al. |
| 6,006,249 | A | 12/1999 | Leong |
| 6,016,395 | A | 1/2000 | Mohamed |
| 6,021,186 | A | 2/2000 | Suzuki et al. |
| 6,021,492 | A | 2/2000 | May |
| 6,023,742 | A | 2/2000 | Ebeling et al. |
| 6,023,755 | A | 2/2000 | Casselman |
| 6,028,610 | A | 2/2000 | Deering |
| 6,036,166 | A | 3/2000 | Olson |
| 6,039,219 | A | 3/2000 | Bach et al. |
| 6,041,322 | A | 3/2000 | Meng et al. |
| 6,041,970 | A | 3/2000 | Vogel |
| 6,046,603 | A | 4/2000 | New |
| 6,047,115 | A | 4/2000 | Mohan et al. |
| 6,052,600 | A | 4/2000 | Fette et al. |
| 6,055,314 | A | 4/2000 | Spies et al. |
| 6,056,194 | A | 5/2000 | Kolls |
| 6,059,840 | A | 5/2000 | Click, Jr. |
| 6,061,580 | A | 5/2000 | Altschul et al. |
| 6,073,132 | A | 6/2000 | Gehman |
| 6,076,174 | A | 6/2000 | Freund |
| 6,078,736 | A | 6/2000 | Guccione |
| 6,085,740 | A | 7/2000 | Ivri et al. |
| 6,088,043 | A | 7/2000 | Kelleher et al. |
| 6,091,263 | A | 7/2000 | New et al. |
| 6,091,765 | A | 7/2000 | Pietzold, III et al. |
| 6,094,065 | A | 7/2000 | Tavana et al. |
| 6,094,726 | A | 7/2000 | Gonion et al. |
| 6,111,893 | A | 8/2000 | Volftsun et al. |
| 6,111,935 | A | 8/2000 | Hughes-Hartogs |
| 6,115,751 | A | 9/2000 | Tam et al. |
| 6,120,551 | A | 9/2000 | Law et al. |
| 6,122,670 | A | 9/2000 | Bennett et al. |
| 6,138,693 | A | 10/2000 | Matz |
| 6,141,283 | A | 10/2000 | Bogin et al. |
| 6,150,838 | A | 11/2000 | Wittig et al. |
| 6,154,494 | A | 11/2000 | Sugahara et al. |
| 6,157,997 | A | 12/2000 | Oowaki et al. |
| 6,175,854 | B1 | 1/2001 | Bretscher |
| 6,175,892 | B1 | 1/2001 | Sazzad et al. |
| 6,181,981 | B1 | 1/2001 | Varga et al. |
| 6,185,418 | B1 | 2/2001 | MacLellan et al. |
| 6,192,070 | B1 | 2/2001 | Poon et al. |
| 6,192,255 | B1 | 2/2001 | Lewis et al. |
| 6,192,388 | B1 | 2/2001 | Cajolet |
| 6,195,788 | B1 | 2/2001 | Leaver et al. |
| 6,198,924 | B1 | 3/2001 | Ishii et al. |
| 6,199,181 | B1 | 3/2001 | Rechef et al. |
| 6,202,130 | B1 | 3/2001 | Scales, III et al. |
| 6,219,697 | B1 | 4/2001 | Lawande et al. |
| 6,219,756 | B1 | 4/2001 | Kasamizugami |
| 6,219,780 | B1 | 4/2001 | Lipasti |
| 6,223,222 | B1 | 4/2001 | Fijolek et al. |
| 6,226,387 | B1 | 5/2001 | Tewfik et al. |
| 6,230,307 | B1 | 5/2001 | Davis et al. |
| 6,237,029 | B1 | 5/2001 | Master et al. |
| 6,246,883 | B1 | 6/2001 | Lee |
| 6,247,125 | B1 | 6/2001 | Noel-Baron et al. |
| 6,249,251 | B1 | 6/2001 | Chang et al. |
| 6,258,725 | B1 | 7/2001 | Lee et al. |
| 6,263,057 | B1 | 7/2001 | Silverman |
| 6,266,760 | B1 | 7/2001 | DeHon et al. |
| 6,272,579 | B1 | 8/2001 | Lentz et al. |
| 6,281,703 | B1 | 8/2001 | Furuta et al. |

| | | |
|---|---|---|
| 6,282,627 B1 | 8/2001 | Wong et al. |
| 6,289,375 B1 | 9/2001 | Knight et al. |
| 6,289,434 B1 | 9/2001 | Roy |
| 6,289,488 B1 | 9/2001 | Dave et al. |
| 6,292,822 B1 | 9/2001 | Hardwick |
| 6,292,827 B1 | 9/2001 | Raz |
| 6,292,830 B1 | 9/2001 | Taylor et al. |
| 6,301,653 B1 | 10/2001 | Mohamed et al. |
| 6,305,014 B1 | 10/2001 | Roediger et al. |
| 6,311,149 B1 | 10/2001 | Ryan et al. |
| 6,321,985 B1 | 11/2001 | Kolls |
| 6,346,824 B1 | 2/2002 | New |
| 6,347,346 B1 | 2/2002 | Taylor |
| 6,349,394 B1 | 2/2002 | Brock et al. |
| 6,353,841 B1 | 3/2002 | Marshall et al. |
| 6,356,994 B1 | 3/2002 | Barry et al. |
| 6,359,248 B1 | 3/2002 | Mardi |
| 6,360,256 B1 | 3/2002 | Lim |
| 6,360,259 B1 | 3/2002 | Bradley |
| 6,360,263 B1 | 3/2002 | Kurtzberg et al. |
| 6,363,411 B1 | 3/2002 | Dugan et al. |
| 6,366,999 B1 | 4/2002 | Drabenstott et al. |
| 6,377,983 B1 | 4/2002 | Cohen et al. |
| 6,378,072 B1 | 4/2002 | Collins et al. |
| 6,381,735 B1 | 4/2002 | Hunt |
| 6,385,751 B1 | 5/2002 | Wolf |
| 6,405,214 B1 | 6/2002 | Meade, II |
| 6,408,039 B1 | 6/2002 | Ito |
| 6,410,941 B1 | 6/2002 | Taylor et al. |
| 6,411,612 B1 | 6/2002 | Halford et al. |
| 6,421,372 B1 | 7/2002 | Bierly et al. |
| 6,421,809 B1 | 7/2002 | Wuytack et al. |
| 6,430,624 B1 | 8/2002 | Jamtgaard et al. |
| 6,433,578 B1 | 8/2002 | Wasson |
| 6,434,590 B1 | 8/2002 | Blelloch et al. |
| 6,438,737 B1 | 8/2002 | Morelli et al. |
| 6,456,996 B1 | 9/2002 | Crawford, Jr. et al. |
| 6,459,883 B2 | 10/2002 | Subramanian et al. |
| 6,473,609 B1 | 10/2002 | Schwartz et al. |
| 6,507,947 B1 | 1/2003 | Schreiber et al. |
| 6,510,138 B1 | 1/2003 | Pannell |
| 6,510,510 B1 | 1/2003 | Garde |
| 6,538,470 B1 | 3/2003 | Langhammer et al. |
| 6,556,044 B2 | 4/2003 | Langhammer et al. |
| 6,563,891 B1 | 5/2003 | Eriksson et al. |
| 6,570,877 B1 | 5/2003 | Kloth et al. |
| 6,577,678 B2 | 6/2003 | Scheuermann |
| 6,587,684 B1 | 7/2003 | Hsu et al. |
| 6,590,415 B2 | 7/2003 | Agrawal et al. |
| 6,601,086 B1 | 7/2003 | Howard et al. |
| 6,601,158 B1 | 7/2003 | Abbott et al. |
| 6,604,085 B1 | 8/2003 | Kolls |
| 6,606,529 B1 * | 8/2003 | Crowder et al. ............. 700/100 |
| 6,615,333 B1 | 9/2003 | Hoogerbrugge et al. |
| 6,618,434 B2 | 9/2003 | Heidari-Bateni et al. |
| 6,640,304 B2 | 10/2003 | Ginter et al. |
| 6,653,859 B2 | 11/2003 | Sihlbom et al. |
| 6,675,265 B2 | 1/2004 | Barroso et al. |
| 6,691,148 B1 | 2/2004 | Zinky et al. |
| 6,711,617 B1 | 3/2004 | Bantz et al. |
| 6,718,182 B1 | 4/2004 | Kung |
| 6,721,286 B1 | 4/2004 | Williams et al. |
| 6,721,884 B1 | 4/2004 | De Oliveira Kastrup Pereira et al. |
| 6,732,354 B2 * | 5/2004 | Ebeling et al. ............. 717/119 |
| 6,735,621 B1 | 5/2004 | Yoakum et al. |
| 6,738,744 B2 | 5/2004 | Kirovski et al. |
| 6,748,360 B2 | 6/2004 | Pitman et al. |
| 6,754,470 B2 | 6/2004 | Hendrickson et al. |
| 6,760,587 B2 | 7/2004 | Holtzman et al. |
| 6,766,165 B2 | 7/2004 | Sharma et al. |
| 6,778,212 B1 | 8/2004 | Deng et al. |
| 6,785,341 B2 | 8/2004 | Walton et al. |
| 6,819,140 B2 | 11/2004 | Yamanaka et al. |
| 6,823,448 B2 | 11/2004 | Roth et al. |
| 6,829,633 B2 | 12/2004 | Gelfer et al. |
| 6,832,250 B1 | 12/2004 | Coons et al. |
| 6,836,839 B2 * | 12/2004 | Master et al. ................. 712/29 |
| 6,865,664 B2 | 3/2005 | Budrovic et al. |
| 6,871,236 B2 | 3/2005 | Fishman et al. |
| 6,883,084 B1 | 4/2005 | Donohoe |
| 6,894,996 B2 | 5/2005 | Lee |
| 6,901,440 B1 | 5/2005 | Bimm et al. |
| 6,912,515 B2 * | 6/2005 | Jackson et al. ................. 706/19 |
| 6,985,517 B2 | 1/2006 | Matsumoto et al. |
| 6,986,021 B2 | 1/2006 | Master et al. |
| 6,988,139 B1 | 1/2006 | Jervis et al. |
| 7,032,229 B1 | 4/2006 | Flores et al. |
| 7,044,741 B2 | 5/2006 | Leem |
| 7,082,456 B2 | 7/2006 | Mani-Meitav et al. |
| 7,139,910 B1 | 11/2006 | Ainsworth et al. |
| 7,142,731 B1 | 11/2006 | Toi |
| 7,249,242 B2 | 7/2007 | Ramchandran |
| 2001/0003191 A1 | 6/2001 | Kovacs et al. |
| 2001/0023482 A1 | 9/2001 | Wray |
| 2001/0029515 A1 | 10/2001 | Mirsky |
| 2001/0034795 A1 | 10/2001 | Moulton et al. |
| 2001/0039654 A1 | 11/2001 | Miyamoto |
| 2001/0048713 A1 | 12/2001 | Medlock et al. |
| 2001/0048714 A1 | 12/2001 | Jha |
| 2001/0050948 A1 | 12/2001 | Ramberg et al. |
| 2002/0010848 A1 | 1/2002 | Kamano et al. |
| 2002/0013799 A1 | 1/2002 | Blaker |
| 2002/0013937 A1 | 1/2002 | Ostanevich et al. |
| 2002/0015435 A1 | 2/2002 | Rieken |
| 2002/0015439 A1 | 2/2002 | Kohli et al. |
| 2002/0023210 A1 | 2/2002 | Tuomenoksa et al. |
| 2002/0024942 A1 | 2/2002 | Tsuneki et al. |
| 2002/0024993 A1 | 2/2002 | Subramanian et al. |
| 2002/0031166 A1 | 3/2002 | Subramanian et al. |
| 2002/0032551 A1 | 3/2002 | Zakiya |
| 2002/0035623 A1 | 3/2002 | Lawande et al. |
| 2002/0041581 A1 | 4/2002 | Aramaki |
| 2002/0042907 A1 | 4/2002 | Yamanaka et al. |
| 2002/0061741 A1 | 5/2002 | Leung et al. |
| 2002/0069282 A1 | 6/2002 | Reisman |
| 2002/0072830 A1 | 6/2002 | Hunt |
| 2002/0078337 A1 | 6/2002 | Moreau et al. |
| 2002/0083305 A1 | 6/2002 | Renard et al. |
| 2002/0083423 A1 | 6/2002 | Ostanevich et al. |
| 2002/0087829 A1 | 7/2002 | Snyder et al. |
| 2002/0089348 A1 | 7/2002 | Langhammer |
| 2002/0101909 A1 | 8/2002 | Chen et al. |
| 2002/0107905 A1 | 8/2002 | Roe et al. |
| 2002/0107962 A1 | 8/2002 | Richter et al. |
| 2002/0119803 A1 | 8/2002 | Bitterlich et al. |
| 2002/0120672 A1 | 8/2002 | Butt et al. |
| 2002/0138716 A1 | 9/2002 | Master et al. |
| 2002/0141489 A1 | 10/2002 | Imaizumi |
| 2002/0147845 A1 | 10/2002 | Sanchez-Herrero et al. |
| 2002/0159503 A1 | 10/2002 | Ramachandran |
| 2002/0162026 A1 | 10/2002 | Neuman et al. |
| 2002/0168018 A1 | 11/2002 | Scheuermann |
| 2002/0181559 A1 | 12/2002 | Heidari-Bateni et al. |
| 2002/0184291 A1 | 12/2002 | Hogenauer |
| 2002/0184498 A1 | 12/2002 | Qi |
| 2002/0191790 A1 | 12/2002 | Anand et al. |
| 2003/0007606 A1 | 1/2003 | Suder et al. |
| 2003/0012270 A1 | 1/2003 | Zhou et al. |
| 2003/0018446 A1 | 1/2003 | Makowski et al. |
| 2003/0018700 A1 | 1/2003 | Giroti et al. |
| 2003/0023830 A1 | 1/2003 | Hogenauer |
| 2003/0026242 A1 | 2/2003 | Jokinen et al. |
| 2003/0030004 A1 | 2/2003 | Dixon et al. |
| 2003/0046421 A1 | 3/2003 | Horvitz et al. |
| 2003/0061260 A1 | 3/2003 | Rajkumar |
| 2003/0061311 A1 | 3/2003 | Lo |

| | | | |
|---|---|---|---|
| 2003/0063656 A1 | 4/2003 | Rao et al. | |
| 2003/0076815 A1 | 4/2003 | Miller et al. | |
| 2003/0088223 A1 | 5/2003 | Chang et al. | |
| 2003/0102889 A1 | 6/2003 | Master et al. | |
| 2003/0105949 A1* | 6/2003 | Master et al. | 713/100 |
| 2003/0110485 A1 | 6/2003 | Lu et al. | |
| 2003/0142818 A1 | 7/2003 | Raghunathan et al. | |
| 2003/0154357 A1 | 8/2003 | Master et al. | |
| 2003/0163723 A1 | 8/2003 | Kozuch et al. | |
| 2003/0172138 A1 | 9/2003 | McCormack et al. | |
| 2003/0172139 A1 | 9/2003 | Srinivasan et al. | |
| 2003/0200538 A1* | 10/2003 | Ebeling et al. | 717/160 |
| 2003/0212684 A1 | 11/2003 | Meyer et al. | |
| 2004/0006584 A1 | 1/2004 | Vandeweerd | |
| 2004/0010645 A1 | 1/2004 | Scheuermann et al. | |
| 2004/0015970 A1 | 1/2004 | Scheuermann | |
| 2004/0025159 A1 | 2/2004 | Scheuermann et al. | |
| 2004/0057505 A1 | 3/2004 | Valio | |
| 2004/0062300 A1 | 4/2004 | McDonough et al. | |
| 2004/0081248 A1 | 4/2004 | Parolari | |
| 2004/0093479 A1 | 5/2004 | Ramchandran | |
| 2004/0168044 A1 | 8/2004 | Ramchandran | |
| 2005/0166038 A1 | 7/2005 | Wang et al. | |
| 2005/0198199 A1 | 9/2005 | Dowling | |
| 2006/0031660 A1 | 2/2006 | Master et al. | |

FOREIGN PATENT DOCUMENTS

| | | |
|---|---|---|
| EP | 0 301 169 A1 | 2/1989 |
| EP | 0 166 586 B1 | 1/1991 |
| EP | 0 236 633 B1 | 5/1991 |
| EP | 0 478 624 B1 | 4/1992 |
| EP | 0 479 102 A2 | 4/1992 |
| EP | 0 661 831 A2 | 7/1995 |
| EP | 0 668 659 A2 | 8/1995 |
| EP | 0 690 588 A2 | 1/1996 |
| EP | 0 691 754 A2 | 1/1996 |
| EP | 0 768 602 A2 | 4/1997 |
| EP | 0 817 003 A2 | 1/1998 |
| EP | 0 821 495 A2 | 1/1998 |
| EP | 0 866 210 A2 | 9/1998 |
| EP | 0 923 247 A2 | 6/1999 |
| EP | 0 926 596 A2 | 6/1999 |
| EP | 1 056 217 A2 | 11/2000 |
| EP | 1 061 437 A1 | 12/2000 |
| EP | 1 061 443 A2 | 12/2000 |
| EP | 1 126 368 A2 | 8/2001 |
| EP | 1 150 506 A2 | 10/2001 |
| EP | 1 189 358 A1 | 3/2002 |
| GB | 2 067 800 A | 7/1981 |
| GB | 2 237 908 A | 5/1991 |
| JP | 62-249456 | 10/1987 |
| JP | 63-147258 | 6/1988 |
| JP | 4-51546 | 2/1992 |
| JP | 7-064789 | 3/1995 |
| JP | 7066718 | 3/1995 |
| JP | 10233676 | 9/1998 |
| JP | 10254696 | 9/1998 |
| JP | 11296345 | 10/1999 |
| JP | 2000315731 | 11/2000 |
| JP | 2001-053703 | 2/2001 |
| WO | WO 89/05029 A1 | 6/1989 |
| WO | WO 89/11443 A2 | 11/1989 |
| WO | WO 91/00238 A1 | 1/1991 |
| WO | WO 93/13603 A1 | 7/1993 |
| WO | WO 95/11855 A1 | 5/1995 |
| WO | WO 96/33558 A1 | 10/1996 |
| WO | WO 98/32071 A3 | 7/1998 |
| WO | WO 99/03776 A1 | 1/1999 |
| WO | WO 99/21094 A2 | 4/1999 |
| WO | WO 99/26860 A1 | 6/1999 |
| WO | WO 99/65818 A1 | 12/1999 |
| WO | WO 00/19311 A1 | 4/2000 |
| WO | WO 00/65855 A1 | 11/2000 |
| WO | WO 00/69073 A1 | 11/2000 |
| WO | WO 01/11281 A1 | 2/2001 |
| WO | WO 01/22235 A1 | 3/2001 |
| WO | WO 01/76129 A2 | 10/2001 |
| WO | WO 02/12978 A2 | 2/2002 |

OTHER PUBLICATIONS

"Algorithm Analysis and Mapping Environment for Adaptive Computing Systems", Pauer et al, Presentation slides, Third Bi-annual Ptolemy Miniconference, Feb. 1999.*

"Algorithm Analysis and Mapping Environment for Adaptive Computing Systems", J.C. Zaino, Final Technical Report, DARPA Contract F33615-97-C-1174, Sep. 2001.*

Abnous et al., "Ultra-Low-Power Domain-Specific Multimedia Processors," VLSI Signal Processing, IX, 1998, IEEE Workshop in San Francisco, CA, USA, Oct. 30-Nov. 1, 1998, pp. 461-470 (Oct. 30, 1998).

Aggarwal et al.., "Efficient Huffman Decoding," International Conference on Image Processing IEEE 1:936-939 (Sep. 10-13, 2000).

Allan et al., "Software Pipelining," ACM Computing Surveys, 27(3):1-78 (Sep. 1995).

Alsolaim et al., "Architecture and Application of a Dynamically Reconfigurable Hardware Array for Future Mobile Communication Systems," Field Programmable Custom Computing Machines, 2000 IEEE Symposium, Napa Valley, Los Alamitos, CA. IEEE Comput. Soc. pp. 205-214 (Apr. 17-19, 2000).

Ashenden et al., "The VHDL Cookbook," Dept. Computer Science, University of Adelaide, South Australia. Downloaded from http://tams-www.informatik.uni-hamburg.de/vhdl/doc/cookbook/VHDL-Cookbook.pdf on Dec. 7, 2006 (Jul. 1990).

Bacon et al., "Compiler Transformations for High-Performance Computing," ACM Computing Surveys 26(4):368-373 (Dec. 1994).

Balasubramonian et al., "Reducing the Complexity of the Register File in Dynamic Superscalar Processors," Proceedings of the 34th Annual ACM/IEEE International Symposium on Microarchitecture, pp. 237-248 (Dec. 1, 2001).

Banerjee et al., "A Matlab Compiler for Distributed, Heterogeneous, Reconfigurable Computing Systems," 2000 IEEE Symposium, pp. 39-48, (Apr. 17-19, 2000).

Bapte et al., "Uniform Execution Environment for Dynamic Reconfiguration," Darpa Adaptive Computing Systems, http://isis.vanderbilt.edu/publications/archive/babty_T_#_0_1999_Uniform_Ex.pdf, pp. 1-7 (1999).

Baumgarte et al., "PACT XPP—A Self-Reconfigurable Data Processing Architecture," NN www.pactcorp.com/sneu/download/ersa01.pdf; retrieved on Nov. 25, 2005 (Jun. 25, 2001).

Becker et al., "An Application-Tailored Dynamically Reconfigurable Hardware Architecture for Digital Baseband Processing," IEEE Conference Proceedings Article pp. 341-346 (Sep. 18, 2000).

Becker et al., "Design and Implementation of a Coarse-Grained Dynamically Reconfigurable Hardware Architecture," VLSI 2001, Proceedings IEEE Computer Soc. Workshop, Piscataway, NJ, USA, pp. 41-46 (Apr. 19-20, 2001).

Bevstar, BevStar Bottled Water Model Advertisement *Automatic Merchandiser* at www.AMonline.com (2005).

Bevstar, Bevstar Point of Use Water Model Advertisement *Automatic Merchandiser* at www.AMonline.com (2005).

Bishop & Loucks, "A Heterogeneous Environment for Hardware/Software Cosimulation," Proceedings of the 30th Annual Simulation Symposium, pp. 14-22 (Apr. 7-9, 1997).

Brakensiek et al., "Re-Configurable Multi-Standard Terminal for Heterogeneous Networks," Radio and Wireless Conference, Rawcon 2002 IEEE. pp. 27-30 (2002).

Brown et al., "Quick PDA Data Exchange," PC Magazine pp. 1-3 (May 22, 2001).

Buck et al., "Ptolemy: A Framework for Simulating and Prototyping Heterogeneous Systems," International Journal of Computer Simulation 4:155-182 (Apr. 1994).

Burns et al., "A Dynamic Reconfiguration Run-Time System," Proceedings of the 5th Annual Symposium on Field-Programmable Custom Computing Machines, pp. 166-175 (Apr. 16, 1997).

Business Wire, "Whirlpool Internet-Enabled Appliances to Use Beeline Shopper Software Features," http://www.whirlpoocorp.com/news/releases/release.asp?rid=90 (Feb. 16, 2001).

Buttazzo et al., "Optimal Deadline Assignment for Scheduling Soft Aperiodic Tasks in Hard Real-Time Environments," Engineering of Complex Computer Systems, Proceedings of the Third IEEE International Conference on Como, pp. 39-48 (Sep. 8, 1997).

Callahan et al., "Adapting Software Pipelining for Reconfigurable Computing," in Proceedings of the International Conference on Compilers, Architectrue and Synthesis for Embedded Systems p. 8, ACM (CASES '00, San Jose, CA) (Nov. 17-18, 2000).

Chapman & Mehrotra, "OpenMP and HPF: Integrating Two Paradigms," Proceedings of the 4th International Euro-Par Conference (Euro-Par'98), Springer-Verlag Heidelberg, Lecture Notes in Computer Science 1470:650-658 (1998).

Chen et al., "A Reconfigurable Multiprocessor IC for Rapid Prototyping of Algorithmic-Specific High-Speed DSP Data Paths," IEEE Journal of Solid-State Circuits, IEEE 35:74-75 (Feb. 1, 2001).

Clarke, "Embedded Solutions Enters Development Pact with Marconi," EETimes Online (Jan. 26, 2000).

Compton & Hauck, "Reconfigurable Computing: A Survey of Systems and Software," ACM Press, ACM Computing Surveys (CSUR) 34(2):171-210 (Jun. 2002).

Compton et al., "Configuration Relocation and Defragmentation for Run-Time Reconfigurable Computing," Northwestern University, http://citeseer.nj.nec.com/compton00configuration.html, pp. 1-17 (2000).

Conte et al., "Dynamic Rescheduling: A Technique for Object Code Compatibility in VLIW Architectures," Proceedings of the 28th Annulal International Symposium on Microarchitecture pp. 208-218 (Nov. 29, 1995).

Conte et al., "Instruction Fetch Mechanisms for VLIW Architectures with Compressed Encodings," Proceedings of the Annual IEEE/ACM International Symposium on Microarchitecture (MICRO) 29:201-211 (Dec. 2, 1996).

Cray Research Inc., "Cray T3E Fortran Optimization Guide," Ver. 004-2518-002, Section 4.5 (Jan. 1999).

Cummings et al., "FPGA in the Software Radio," IEEE Communications Magazine . 37(2):108-112 (Feb. 1999).

Dandalis et al., "An Adaptive Cryptographic Engine for IPSec Architectures," IEEE pp. 132-141 (Jan. 2000).

David et al., "DART: A Dynamically Reconfigurable Architecture Dealing with Future Mobile Telecommunication Constraints," Proceedings of the International Parallel and Distributed Processing Symposium pp. 156-163 (Apr. 15, 2002).

Deepakumara et al., "FPGA Implementation of MD5 has Algorithm," Canadian Conference on Electrical and Computer Engineering, IEEE (2001).

Dehon et al., "Reconfigurable Computing: What, Why and Implications for Design Automation," Design Automation Conference Proceedings pp. 610-615 (1999).

Dipert, "Figuring Out Reconfigurable Logic," EDN 44(16):107-114 (Aug. 5, 1999).

Dominikus, "A Hardware Implementation of MD4-Family Hash Algorithms," 9th International Conference on Electronics, Circuits and Systems IEEE (2002).

Dorband, "aCe C Lanugage Reference Guide," Online (Archived Mar. 2001), http://web.archive.org/web/20000616053819/http://newton.gsfc.nasa.gov/aCe/aCe_dir/aCe_cc_Ref.html (Mar. 2001).

Drozdowski, "Scheduling Multiprocessor Task—An Overview," Instytut Informatyki Politechnika, pp. 1-31 (Jan. 31, 1996).

Ebeling et al., "RaPiD Reconfigurable Pipelined Datapath," Springer-Verlag, 6th International Workshop on Field-Programmable Logic and Applications pp. 126-135 (1996).

Fawer et al., "A Multiprocessor Approach for Implementing a Time-Diversity Spread Spectrum Receiver," Proceeding sof the 1990 International Zurich Seminal on Digital Communications, pp. 173-180 (Mar. 5-8, 1990).

Fisher, "Gone Flat," Forbes pp. 76-79 (Oct. 2001).

Fleischmann et al., "Prototyping Networked Embedded Systems," Integrated Engineering, pp. 116-119 (Feb. 1999).

Forbes "Best of the Web—Computer Networking/Consumer Durables," *The Forbes Magnetic 40* p. 80 (May 2001).

Gibson, "Fresh Technologies Will Create Myriad Functions," FT Information Technology Review; World Wide Web at http://technews.acm.org/articles/2000-2/0301w.html?searchterm=%22fresh+technologies%22 (Mar. 1, 2000).

Gluth, "Integrierte Signalprozessoren," Elektronik 35(18):112-118 Franzis Verlag GMBH, Munich, Germany (Sep. 5, 1986).

Gokhale & Schlesinger,"A Data Parallel C and Its Platforms," Proceedings of the Fifth Symposium on the Frontiers of Massively Parallel Computation pp. 194-202 (Frontiers '95) (Feb. 1995).

Grimm et al., "A System Architecture for Pervasive Computing," Washington University, pp. 1-6 (Sep. 2000).

Halbwachs et al., "The Synchronous Data Flow Programming Language LUSTRE," Proceedings of the IEEE 79(9):1305-1319 (Sep. 1991).

Hammes et al., "Cameron: High Level Language Compilation for Reconfigurable Systems," Proc. of the Intl. Conf. on Parallel Architectures and Compilation Techniques, pp. 236-244 (Oct. 1999).

Hartenstein, "Coarse Grain Reconfigurable Architectures," Design Automation Conference, 2001. Proceedings of the ASP-Dac 2001, Asian and South Pacific Jan. 30, 2001-Feb. 2, 2001, Piscataway, Nj, US, IEEE, pp. 564-569 (Jan. 30, 2001).

Heinz, "An Efficiently Compilable Extension of {M} odula-3 for Problem-Oriented Explicitly Parallel Programming," Proceedings of the Joint Symposium on Parallel Processing (May 1993).

Hinden et al., "The DARPA Internet: Interconnecting Heterogeneous Computer Networks with Gateways," IEEE Computer Magazine pp. 38-48 (1983).

Horton, "Beginning Java 2: JDK 1.3 Edition," Wrox Press, Chapter 8, pp. 313-316 (Feb. 2001).

Huff et al., "Lifetime-Sensitive Modulo Scheduling," 6th Conference on Programming Language, Design and Implementation, pp. 258-267, ACM (1993).

IBM, "Multisequencing a Single Instruction Stream Scheduling with Space-time Trade-offs," IBM Technical Disclosure Bulletin 36(2):105-108 (Feb. 1, 1993).

IEEE, "IEEE Standard Verilog Hardware Description Language," downloaded from http://inst.eecs.berkeley.edu/~cs150/fa06/Labs/verilog-ieee.pdf on Dec. 7, 2006 (Sep. 2001).

Internet Wire, Sunbeam Joins Microsoft in University Plug and Play Forum to Establish A "Universal" Smart Appliance Technology Standard (Mar. 23, 2000).

ISHII et al., "Parallel Variable Length Decoding with Inverse Quantization for Software MPEG-2 Decoders," Workshop on Signal Processing Systems, Design and Implementation, IEEE pp. 500-509 (Nov. 3-5, 1997).

Isoworth, "Isoworth Beverage Dispensing Technology Worldwide Company," Brochure (May 22, 2000).

Jain et al., "An Alternative Approach Towards the Design of Control Units," Microelectronics and Reliability 24(6):1009-1012 (1984).

Jain, "Parallel Processing with the TMS320C40 Parallel Digital Signal Processor," Sonitech International Inc., pp. 13-46. Retrieved from: http://www-s.ti.com/sc/psheets/spra031.pdf retrieved on Apr. 14, 2004 (Feb. 1994).

Janssen et al., "Partitioned Register File for TTAs," Proceedings of the 28th Annual International Symposium on Microarchitecture, pp. 303-312 (Nov. 1995).

Jong-Pyng et al., "Real-Time Virtual Channel Flow Control," Proceedings of the Annual International Phoenix Conference on Computers and Communications, Conf. 13, pp. 97-103 (Apr. 12, 1994).

Jung et al., "Efficient Hardware Controller Synthesis for Synchronous Dataflow Graph in System Level Design," Proceedings of the 13th International Symposium on System Synthesis pp. 79-84 (ISSS'00) (Sep. 2000).

Kaufmann t al., "Digital Spread-Spectrum Multipath-Diversity Receiver for Indoor Communication," from Pioneers to the 21st Century; Denver, Proceedings of the Vehicular Technology Socity [sic] Conference, NY, IEEE, US 2(Conf. 42):1038-1041 (May 10-13, 1992).

Kneip et al., "An Algorithm Adapted Autonomous Controlling Concept for a Parallel Single-Chip Digital Signal Processor," Journal of VLSI Signal Processing Systems for Signal, Image, and dVideo Technology 16(1):31-40 (May 1, 1997).

Lee & Messerschmitt, "Pipeline Interleaved Programmable DSP's: Synchronous Data Flow Programming," IEEE Transactions on Acoustics, Speech, and Signal Processing ASSP-35(9):1334-1345 (Sep. 1987).

Lee & Messerschmitt, "Synchronous Data Flow," Proceedings of the IEEE 75(9):1235-1245 (Sep. 1987).

Lee & Parks, "Dataflow Process Networks," Proceedings of the IEEE 83(5):773-799 (May 1995).

Liu et al., "Scheduling Algorithms for Multiprogramming in a Hard-Real-Time Environment," *Journal of the Association for Computing* 20(1):46-61 (1973).

Llosa et al., "Lifetime-Sensitive Modulo Scheduling in a Production Environment," IEEE Trans. on Comps. 50(3):234-249 (Mar. 2001).

Lu et al., "The Morphosys Dynamically Reconfigurable System-On-Chip," Proceedings of the First NASA/DOD Workshop on Evolvable Hardware, pp. 152-160 (Jul. 19, 1999).

Mangione-Smith et al., "Seeking Solutions in Configurable Computing," *Computer* 30(12):38-43 (Dec. 1997).

Manion, "Network CPU Adds Spice," Electronic Engineering Times, Issue 1126 (Aug. 14, 2000).

Mascia & Ishii., "Neural Net Implementation on Single-Chip Digital Signal Processor," IEEE (1989).

McGraw, "Parallel Functional Programming in Sisal: Fictions, Facts, and Future," Lawrence Livermore National Laboratory pp. 1-40 (Jul. 1993).

Najjar et al., "High-Level Language Abstraction for Reconfigurable Computing," *Computer* 36(8):63-69 (Aug. 2003).

Nichols et al., "Data Management and Control-Flow Constructs in a SIMD/SPMD Parallel Language/Compiler," Proceedings of the 3rd Symposium on the Frontiers of Massively Parallel Computation pp. 397-406 (Oct. 1990).

OpenMP Architecture Review Board, "OpenMP C and C++ Application Program Interface," pp. 7-16 (Oct. 1998).

Oracle Corporation, "Oracle8i JDBC Developer's Guide and Reference," Release 3, 8.1.7, pp. 10-8-10-10 (Jul. 2000).

Pauer et al., "Algorithm Analysis and Mapping Environment for Adaptive Computing Systems: Further Results," Proc. IEEE Symposium on FPGA's for Custom Computing Machines (FCCM), Napa CA (1999).

Pauer et al., "Algorithm Analysis and Mapping Environment for Adaptive Computing Systems," Presentation slides, Third Bi-annual Ptolemy Miniconference (1999).

Ramamritham et al., "On Scheduling Algorithms for Real-Time Multiprocessor Systems," Algorithms and Applications, Proceedings of the International conference on Parallel Processing 3:143-152 (Aug. 8, 1989).

Schneider, "A Parallel/Serial Trade-Off Methodology for Look-Up Table Based Decoders," Proceedings of the Design Automation Conference 34:498-503 (Jun. 9-13, 1997).

Sidhu et al., "A Self-Reconfigurable Gate Array ARchitecture," 10 International Workshop on Field Programmable Logic and Applications http://coblitz.codeen.org:3125/citeseer.ist.psu.edu/cache/papers/cs/17524/http:zSzzSzmaarcii.usc.eduzSzPublicationsZSzsidhu_fp100.pdf/sidhu00selfreconfigurable.pdf retrieved on Jun. 21, 2006 (Sep. 1, 2001).

Smith, "Intro to ASICs: ASIC Cell Libraries," at http://iroi.seu.edu.cn/books/asics/Book2/CH01/CH01.5.htm, printed on Feb. 4, 2005 (Jun. 1997).

Souza, "Computing's New Face—Reconfigurable Devices Could Rattle Supply Chain," Electronic Buyers' News Issue 1205, p. P.1 (Apr. 3, 2000).

Souza, "Quicksilver Buys White Eagle," Electronic Buyers News, Issue 1220 (Jul. 17, 2000).

Sriram et al., "MPEG-2 Video Decoding on the TMS320C6X DSP Architecture," Conference Record of the 32nd Asilomar Conference on Signals, Systems, and Computers, IEEE pp. 1735-1739 (Nov. 1-4, 1998).

Steiner, "Coke Chief's Latest Daft Idea—A Cola Tap in Every House," Sunday Times (Mar. 2001).

Sun Microsystems, "Fortran 3.0.1 User's Guide, Revision A," pp. 57-68 (Aug. 1994).

Svensson, "Co's Join On Home Web Wiring Network," Associated Press Online printed on Apr. 30, 2008 (Jun. 2000).

Tang et al., "Thread Partitioning and Scheduling Based on Cost Model," Proceedings of the Ninth Annual ACM Symposium on Parallel Algorithms and Architectures, pp. 272-281 Retrieved from: http://doi.acm.org/10.1145/258492.2585 retrieved on Aug. 25, 2004 (1997).

Vaya, "VITURBO: A Reconfigurable Architecture for Ubiquitous Wireless Networks," A Thesis Submitted in Partial Fulfillment of the Requirements for the Degree Master of Science; Rice University (Aug. 2002).

Wang et al., "Cell Search in W-CDMA," IEEE Journal on Selected Areas in Communications 18(8):1470-1482 (Aug. 2000).

Wardell, "Help for Hurried Cooks?," Popular Science, p. 32 (May 2000).

Whiting & Pascoe, "A History of Data-Flow Languages," IEEE Annals of the History of Computing 16(4):38-59 (1994).

Williamson & Lee, "Synthesis of Parallel Hardware Implementations from Synchronous Dataflow Graph Specifications," Conference Record of the Thirtieth Asilomar Conference on Signals, Systems and Computers 1340-1343 (Nov. 1996).

Wirthlin et al., "A Dynamic Instruction Set Computer," Proceedings of the IEEE Symposium on FPGA's for Custom Computing Machines, pp. 99-107 (Apr. 21, 1995).

WWW.APPLIANCEMAGAZINE.COM, World Wide Web at http://web.archive.org/web/20000511085402/http://www.appliancemagazine.com/printed on Apr. 30, 2008.

WWW.BESTROM.COM, BreakMateTM from www.bestrom.com printed on Apr. 29, 2008.

WWW.BEVERAGEEXPRESS.COM, Beverage Express from www.beverageexpress.com printed on Apr. 30, 2008.

WWW.BEVSTAR.COM, Isoworth Beverage Dispensing Technology Worldwide from www.bevstar.com printed on Apr. 30, 2008.

WWW.BONATOR.COM, from The World Wide Web at http://web.archive.org/web/20000510102440/http://www.bonator.com/ printed on Apr. 30, 2008.

WWW.ECOMMERCE.DEWPOINTING.COM, Swiss Mountain Coffees from www.ecommerce.dewpointinc.com printed on Apr. 30, 2008.

WWW.GATEWAY.COM, World Wide Web, http://web.archive.org/web/20000229192734/www.gateway.com/productpages/9300splash/index.shtml Available on Mar. 3, 2000, 1 page (Mar. 3, 2000).

WWW.ICL.COM, from the World Wide Web at http://www.icl.com printed on Apr. 30, 2008.

WWW.MARGHERITA2000.COM; from Margherita2000.com printed Apr. 30, 2008 (Jan. 26, 2001).

WWW.SODACLUBENTERPRISES.COM, Soda-Club Enterprises from www.sodaclubenterprises.com printed on Apr. 30, 2008.

WWW.SYMBOL.COM, Symbol from www.symbol.com printed on Apr. 30, 2008.

WWW.WUNDERBAR.COM, Wunder-Bar Dispensing Systems from www.wunderbar.com printed on Apr. 30, 2008.

Xilinx, "Virtex-II Pro Platform FPGAs: Functional Description DS083-2 (V2.5)," Product Specification, pp. 13-46 (Jan. 20, 2003).

Young, "Architecture Powers up IPSec, SSL," EETimes, Los Gatos, CA, pp. 1-4 http://www.eetimes.com/story/OEG20011102S0065 (Nov. 2, 2001).

Yuan et al., "A Decomposition Approach to Non-Preemptive Real-Time Scheduling," Real Time Systems 6(1):7-35 (1994).

Zaino et al., "Algorithm Analysis and Mapping Environment for Adaptive Computing Systems," Final Technical Report, DARPA Contract F33615-97-C-1174 (Sep. 2001).

Zhang et al., "A IV Heterogeneous Reconfigurable Processor IC for Baseband Wireless Applications," 2000 IEEE Solid.

* cited by examiner

ADAPTIVE COMPUTING ENGINE (ACE)

METHOD, SYSTEM AND PROGRAM FOR DEVELOPING AND SCHEDULING ADAPTIVE INTEGRATED CIRCUITY AND CORRESPONDING CONTROL OR CONFIGURATION INFORMATION

FIELD OF THE INVENTION

The present invention relates, in general, to integrated circuits and systems of integrated circuits. More particularly, the present invention relates to a method, system and program for developing and scheduling adaptive integrated circuitry having fixed, application specific computational elements and also corresponding control or configuration information.

CROSS-REFERENCE TO RELATED APPLICATIONS

This application is related to Paul L. Master et al., U.S. patent application Ser. No. 09/815,122, entitled "Adaptive Integrated Circuitry With Heterogeneous And Reconfigurable Matrices Of Diverse And Adaptive Computational Units Having Fixed, Application Specific Computational Elements", filed Mar. 22, 2001, commonly assigned to QuickSilver Technology, Inc., and incorporated by reference herein, with priority claimed for all commonly disclosed subject matter (the "first related application").

This application is also related to Eugene Hogenauer, U.S. patent application Ser. No. 09/872,397, entitled "Method and System for Scheduling in an Adaptable Computing Engine", filed May 31, 2001, commonly assigned to QuickSilver Technology, Inc., and incorporated by reference herein, with priority claimed for all commonly disclosed subject matter (the "second related application").

This application is further related to Paul L. Master et al., U.S. patent application Ser. No. 09/997,987, entitled "Apparatus, Method, System and Executable Module For Configuration and Operation Of Adaptive Integrated Circuitry Having Fixed, Application Specific Computational Elements", filed Nov. 30, 2001, commonly assigned to QuickSilver Technology, Inc., and incorporated by reference herein, with priority claimed for all commonly disclosed subject matter (the "third related application").

BACKGROUND OF THE INVENTION

The first related application discloses a new form or type of integrated circuitry which effectively and efficiently combines and maximizes the various advantages of processors, application specific integrated circuits ("ASICs"), and field programmable gate arrays ("FPGAs"), while minimizing potential disadvantages. The first related application illustrates a new form or type of integrated circuit ("IC"), referred to as an adaptive computing engine ("ACE"), which provides the programming flexibility of a processor, the post-fabrication flexibility of FPGAs, and the high speed and high utilization factors of an ASIC. This ACE integrated circuitry is readily reconfigurable or adaptive, in advance, in real-time or potentially slower, is capable of having corresponding, multiple modes of operation, and further minimizes power consumption while increasing performance, with particular suitability for low power applications, such as for use in handheld and other battery-powered devices.

The adaptive computing engine ("ACE") circuit of the first related application, for adaptive or reconfigurable computing, includes a plurality of heterogeneous computational elements coupled to an interconnection network, rather than the homogeneous units of FPGAs. The plurality of heterogeneous computational elements include corresponding computational elements having fixed and differing architectures, such as fixed architectures for different functions such as memory, addition, multiplication, complex multiplication, subtraction, configuration, reconfiguration, control, input, output, and field programmability. In response to configuration information, the interconnection network is operative in real-time or potentially slower to adapt and re-adapt (configure and reconfigure) the plurality of heterogeneous computational elements for a plurality of different functional modes, including linear algorithmic operations, non-linear algorithmic operations, finite state machine operations, memory operations, and bit-level manipulations. In turn, this configuration and reconfiguration of heterogeneous computational elements, forming various computational units and adaptive matrices (or adaptive nodes), in real-time or across time, generates the selected operating mode of the ACE integrated circuit, for the performance of a wide variety of tasks.

This ACE integrated circuit, as indicated above, is controlled by a series or sequence of bits, referred to as "configuration information", which generates the configurations and reconfigurations which provide and create one or more operating modes for the ACE circuit, such as wireless communication, radio reception, personal digital assistance ("PDA"), MP3 music playing, or other desired functions.

Current system development tools, typically embodied as computer programs, do not address the particular needs and difficulties of designing ACE circuitry, and developing and scheduling configuration information to allow the ACE IC to perform a selected operating mode. As a consequence, a need remains for a suite of development tools which may design and develop ACE circuitry, adapt one or more algorithms for performance on ACE circuitry, schedule a selected algorithm for execution on selected ACE computational elements, and generate a bit file (as configuration information) for control of the ACE circuitry for the selected operating mode.

SUMMARY OF THE INVENTION

The present invention provides a method, system and program for development of an adaptive computing integrated circuit and corresponding configuration information, in which the configuration information provides an operating mode to the adaptive computing integrated circuit.

The exemplary method (and program) begins with selecting an algorithm for performance by the adaptive computing integrated circuit, such as one or more algorithms which may be used in mobile communications, for example. The algorithm also may be profiled for performance on the adaptive computing integrated circuit.

A plurality of adaptive computing descriptive objects ("ADOs") are then determined. In general, an ADO includes a description of a function, the I/O for the function, a description of a memory resource for the function, the I/O for the memory resource, and a connection between the function and the memory resource. The types of functions which may form an ADO include linear operations, such as addition and multiplication; non-linear operations such as discrete cosine transformation; finite state machine operations; control sequences; bit level manipulations; memory, and memory management.

The method and system then schedule the algorithm with the plurality of adaptive computing descriptive objects to produce a scheduled algorithm and a selected adaptive computing circuit version. Preferably, this includes generating a plurality of adaptive computing circuit versions from the plurality of adaptive computing descriptive objects; scheduling the algorithm with the plurality of adaptive computing descriptive objects of each of the plurality of adaptive computing circuit versions; and using a selection parameter of a plurality of selection parameters, selecting an adaptive computing circuit version, of the plurality of adaptive computing circuit versions, to form the selected adaptive computing circuit version. The plurality of selection parameters, in general, include power consumption, speed of operation, latency, bandwidth requirements, a competing operating mode, and versatility for a plurality of operating modes.

The selected adaptive computing circuit version is converted to a hardware description language for subsequent fabrication to form the adaptive computing integrated circuit. From the scheduled algorithm and the selected adaptive computing circuit version, the method and system generate the configuration information for the performance of the algorithm by the adaptive computing integrated circuit. In the exemplary embodiment, the configuration information is compiled into an adaptive computing integrated circuit bit file, for loading into the adaptive computing integrated circuit.

In the exemplary embodiment, a plurality of versions (or libraries) of configuration information are generated, with each configuration information version corresponding to a selection parameter of a plurality of selection parameters. The plurality of selection parameters include a competing operating mode, versatility for a plurality of operating modes, a selected operational feature set of a plurality of operational feature sets, selected operating conditions of a plurality of operating conditions, and a selected adaptive computing circuit version of a plurality of adaptive computing circuit versions.

This capability for numerous configuration information versions or libraries creates significant versatility for the adaptive computing integrated circuit, for one or more selected operating modes, different hardware versions, different feature sets, different operating conditions, and pre-existing operating modes. An entire library or database of these versions of configuration information may be created in advance or in real time, for each of these different considerations. In addition, additional versions may also be created for different operating conditions, such as power consumption, latency, speed of operation, and bandwidth considerations. A library of such versions (as "multiple binaries") may be stored in multiple locations, such as on a network server, for download into a given adaptive computing circuit by a corresponding service provider.

All of the various processes of the present invention may run off a single set of descriptions, the adaptive computing descriptive objects (or ADOs), for any number of different operating modes, with corresponding algorithms bound-to the hardware through the scheduling process.

Numerous other advantages and features of the present invention will become readily apparent from the following detailed description of the invention and the embodiments thereof, from the claims and from the accompanying drawings.

BRIEF DESCRIPTION OF THE DRAWINGS

The foregoing and other objects, features and advantages of the present invention will be more readily appreciated upon reference to the following disclosure when considered in conjunction with the accompanying drawings, in which.

DETAILED DESCRIPTION OF THE INVENTION

Figure 1:
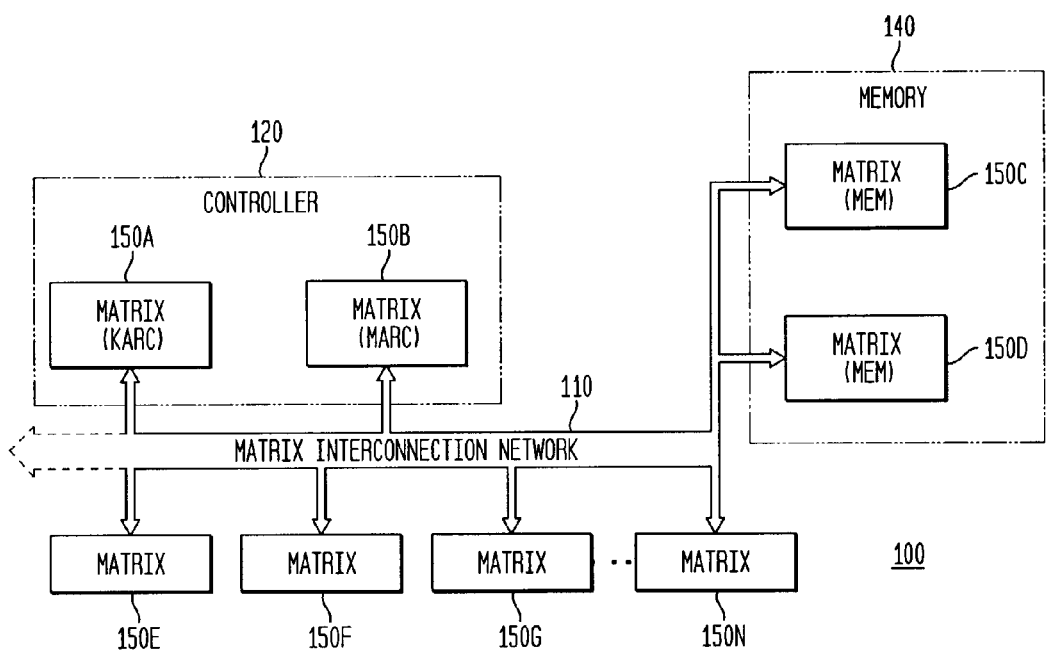
FIG. 1 is a block diagram illustrating an exemplary adaptive computing engine (ACE) embodiment in accordance with the invention of the first related application.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As indicated above, a need remains for a method, program and system to design an ACE circuit, including determining the type, number, placement, and matrix interconnection network ("MIN") routing of or for computational units 200 and computational elements 250, for subsequent fabrication into an integrated circuit. Similarly, how such computational units 200 and computational elements 250 are to be configured and reconfigured to perform a given task must also be determined. In accordance with the present invention, these two sets of tasks occur approximately jointly and interactively, optimizing the IC for a plurality of functions and operating modes. In addition, the present invention enables further IC optimization for speed, size, utilization factors, and power consumption, with additional emphasis on enabling concurrent or parallel computing across multiple computational units 200 and computational elements 250.

In the following discussion, the adaptive integrated circuit (ACE) is described in detail with reference to FIGS. 1 and 2, to provide a foundation for the description of the present invention. Following the description of the ACE IC, the present invention is described, as a method embodiment (FIG. 3) and as a system embodiment (FIG. 4). It should also be understood that, while explained with reference to the ACE architecture, the methodology and systems of the present invention are also applicable to any other adaptive computing architecture which utilize a plurality of different computational elements.

FIG. 1 is a block diagram illustrating an exemplary adaptive computing circuit, referred to as an adaptive computing engine (ACE) 100, which is preferably embodied as an integrated circuit, or as a portion of an integrated circuit having other, additional components. (The ACE 100 is also described in detail in the first related application.) In the exemplary embodiment, and as discussed in greater detail below, the ACE 100 includes one or more reconfigurable matrices (or nodes) 150, such as matrices 150A through 150N as illustrated, and a matrix interconnection network (MIN) 110. Also in the exemplary embodiment, and as discussed in detail below, one or more of the matrices 150, such as matrices 150A and 150B, are configured for functionality as a controller 120, while other matrices, such as matrices 150C and 150D, are configured for functionality as a memory 140. While illustrated as separate matrices 150A through 150D, it should be noted that these control and memory functionalities may be, and preferably are, distributed across a plurality of matrices 150 having additional functions to, for example, avoid any processing or memory "bottlenecks" or other limitations. The various matrices 150 and matrix interconnection network 110 may also be implemented together as fractal subunits, which may be scaled from a few nodes to thousands of nodes. Depending upon the selected embodiment, a processor (such as a microprocessor or digital signal processor ("DSP")) may be included with the ACE 100 in a larger apparatus or system embodiment, and when so included, is preferably a reduced instruction set (RISC) processor.

A significant departure from the prior art, the ACE 100 does not utilize traditional (and typically separate) data, direct memory access (DMA), random access, configuration and instruction busses for signaling and other transmission between and among the reconfigurable matrices 150, the controller 120, and the memory 140, or for other input/output ("I/O") functionality. Rather, data, control and configuration information are transmitted between and among these matrix 150 elements, utilizing the matrix interconnection network 110, which may be configured and reconfigured, to provide any given connection between and among the reconfigurable matrices 150, including those matrices 150 configured as the controller 120 and the memory 140, as discussed in greater detail below.

It should also be noted that once configured, the MIN 110 also and effectively functions as a memory, directly providing the interconnections for particular functions, until and unless it is reconfigured. In addition, such configuration and reconfiguration may occur in advance of the use of a particular function or operation, and/or may occur in real-time or at a slower rate, namely, in advance of, during or concurrently with the use of the particular function or operation. Such configuration and reconfiguration, moreover, may be occurring in a distributed fashion without disruption of function or operation, with computational elements in one location being configured while other computational elements (having been previously configured) are concurrently performing their designated function. This configuration flexibility of the ACE 100 contrasts starkly with FPGA reconfiguration, both which generally occurs comparatively slowly, not in real-time or concurrently with use, and which must be completed in its entirety prior to any operation or other use.

The matrices 150 configured to function as memory 140 may be implemented in any desired or preferred way, utilizing computational elements (discussed below) of fixed memory elements, and may be included within the ACE 100 or incorporated within another IC or portion of an IC. In the exemplary embodiment, the memory 140 is included within the ACE 100, and preferably is comprised of computational elements which are low power consumption random access memory (RAM), but also may be comprised of computational elements of any other form of memory, such as flash, DRAM, SRAM, SDRAM, MRAM, FeRAM, ROM, EPROM or $E^2$PROM. As mentioned, this memory functionality may also be distributed across multiple matrices 150, and may be temporally embedded, at any given time, as a particular MIN 110 configuration. In addition, in the exemplary embodiment, the memory 140 preferably includes direct memory access (DMA) engines, not separately illustrated.

The controller 120 is preferably implemented, using matrices 150A and 150B configured as adaptive finite state machines, as a reduced instruction set ("RISC") processor, controller or other device or IC capable of performing the two types of functionality discussed below. The first control functionality, referred to as "kernel" control, is illustrated as kernel controller ("KARC") of matrix 150A, and the second control functionality, referred to as "matrix" control, is illustrated as matrix controller ("MARC") of matrix 150B.

Figure 2:
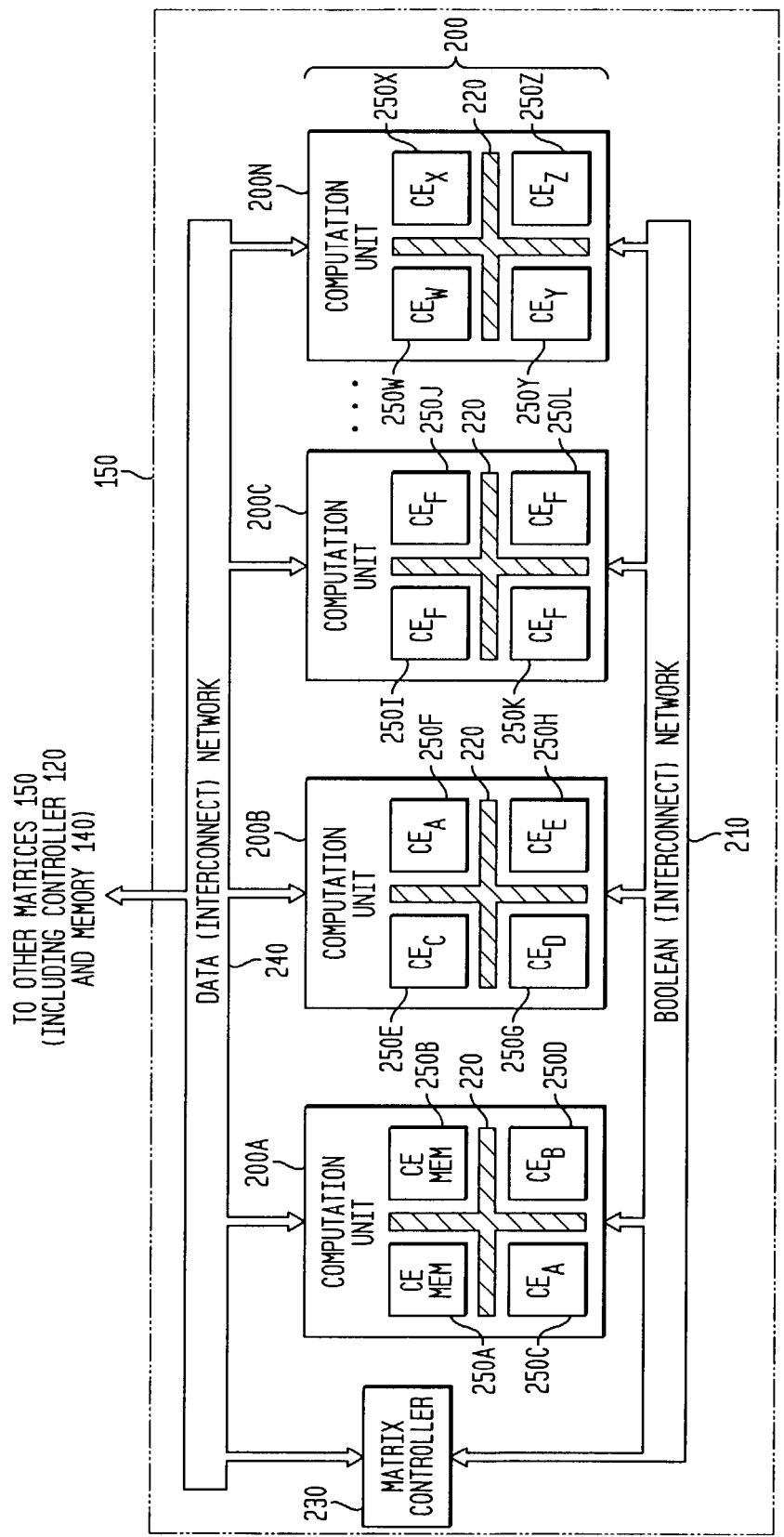
FIG. 2 is a block diagram illustrating a reconfigurable matrix, a plurality of computation units, and a plurality of computational elements, in accordance with the invention of the first related application.

The matrix interconnection network 110 of FIG. 1, and its subset interconnection networks separately illustrated in FIG. 2 (Boolean interconnection network 210, data interconnection network 240, and interconnect 220), collectively and generally referred to herein as "interconnect", "interconnection(s)", "interconnection network(s)" or MIN, provide selectable (or switchable) connections between and among the controller 120, the memory 140, the various matrices 150, and the computational units 200 and computational elements 250 discussed below, providing the physical basis for the configuration and reconfiguration referred to herein, in response to and under the control of configuration signaling generally referred to herein as "configuration information". In addition, the various interconnection networks (110, 210, 240 and 220) provide selectable, routable or switchable data, input, output, control and configuration paths, between and among the controller 120, the memory 140, the various matrices 150, and the computational units 200 and computational elements 250, in lieu of any form of traditional or separate input/output busses, data busses, DMA, RAM, configuration and instruction busses.

The various matrices or nodes 150 are reconfigurable and heterogeneous, namely, in general, and depending upon the desired configuration: reconfigurable matrix 150A is generally different from reconfigurable matrices 150B through 150N; reconfigurable matrix 150B is generally different from reconfigurable matrices 150A and 150C through 150N; reconfigurable matrix 150C is generally different from reconfigurable matrices 150A, 150B and 150D through 150N, and so on. The various reconfigurable matrices 150 each generally contain a different or varied mix of adaptive and reconfigurable computational (or computation) units (200, FIG. 2); the computational units 200, in turn, generally contain a different or varied mix of fixed, application specific computational elements (250, FIG. 2), which may be adaptively connected, configured and reconfigured in various ways to perform varied functions, through the various interconnection networks. In addition to varied internal configurations and reconfigurations, the various matrices 150 may be connected, configured and reconfigured at a higher level, with respect to each of the other matrices 150, through the matrix interconnection network 110.

The ACE architecture utilizes a plurality of fixed and differing computational elements, such as (without limitation) correlators, multipliers, complex multipliers, adders, demodulators, interconnection elements, routing elements, combiners, finite state machine elements, reduced instruction set (RISC) processing elements, bit manipulation elements, input/output (I/O) and other interface elements, and the lower-level "building blocks" which form these units, which may be configured and reconfigured, in response to configuration information, to form the functional blocks (computational units and matrices) which may be needed, at any given or selected time, to perform higher-level functions and, ultimately, to execute or perform the selected operating mode, such as to perform wireless communication functionality, including channel acquisition, voice transmission, multimedia and other data processing. Through the varying levels of interconnect, corresponding algorithms are then implemented, at any given time, through the configuration and reconfiguration of fixed computational elements (250), namely, implemented within hardware which has been optimized and configured for efficiency, i.e., a "machine" is configured in real-time which is optimized to perform the particular algorithm.

Next, the present invention also utilizes a tight coupling (or interdigitation) of data and configuration (or other control)

information, within one, effectively continuous stream of information. This coupling or commingling of data and configuration information, referred to as "silverware" or as a "silverware" module, is the subject of the third related application. For purposes of the present invention, however, it is sufficient to note that this coupling of data and configuration information into one information (or bit) stream, which may be continuous or divided into packets, helps to enable real-time reconfigurability of the ACE 100, without a need for the (often unused) multiple, overlaying networks of hardware interconnections of the prior art. For example, as an analogy, a particular, first configuration of computational elements at a particular, first period of time, as the hardware to execute a corresponding algorithm during or after that first period of time, may be viewed or conceptualized as a hardware analog of "calling" a subroutine in software which may perform the same algorithm. As a consequence, once the configuration of the computational elements has occurred (i.e., is in place), as directed by (a first subset of) the configuration information, the data for use in the algorithm is immediately available as part of the silverware module. The same computational elements may then be reconfigured for a second period of time, as directed by second configuration information (i.e., a second subset of configuration information), for execution of a second, different algorithm, also utilizing immediately available data. The immediacy of the data, for use in the configured computational elements, provides a one or two clock cycle hardware analog to the multiple and separate software steps of determining a memory address and fetching stored data from the addressed registers. This has the further result of additional efficiency, as the configured computational elements may execute, in comparatively few clock cycles, an algorithm which may require orders of magnitude more clock cycles for execution if called as a subroutine in a conventional microprocessor or DSP.

This use of silverware modules, as a commingling of data and configuration information, in conjunction with the reconfigurability of a plurality of heterogeneous and fixed computational elements 250 to form adaptive, different and heterogeneous computation units 200 and matrices 150, enables the ACE 100 architecture to have multiple and different modes of operation. For example, when included within a hand-held device, given a corresponding silverware module, the ACE 100 may have various and different operating modes as a cellular or other mobile telephone, a music player, a pager, a personal digital assistant, and other new or existing functionalities. In addition, these operating modes may change based upon the physical location of the device. For example, while configured for a first operating mode, using a first set of configuration information, as a CDMA mobile telephone for use in the United States, the ACE 100 may be reconfigured using a second set of configuration information for an operating mode as a GSM mobile telephone for use in Europe.

Referring again to FIG. 1, the functions of the controller 120 (preferably matrix (KARC) 150A and matrix (MARC) 150B, configured as finite state machines) may be explained: (1) with reference to a silverware module, namely, the tight coupling of data and configuration information within a single stream of information; (2) with reference to multiple potential modes of operation; (3) with reference to the reconfigurable matrices 150; and (4) with reference to the reconfigurable computation units 200 and the computational elements 250 illustrated in FIG. 2. As indicated above, through a silverware module, the ACE 100 may be configured or reconfigured to perform a new or additional function, such as an upgrade to a new technology standard or the addition of an entirely new function, such as the addition of a music function to a mobile communication device. Such a silverware module may be stored in the matrices 150 of memory 140, or may be input from an external (wired or wireless) source through, for example, matrix interconnection network 110. In the exemplary embodiment, one of the plurality of matrices 150 is configured to decrypt such a module and verify its validity, for security purposes. Next, prior to any configuration or reconfiguration of existing ACE 100 resources, the controller 120, through the matrix (KARC) 150A, checks and verifies that the configuration or reconfiguration may occur without adversely affecting any pre-existing functionality, such as whether the addition of music functionality would adversely affect pre-existing mobile communications functionality. In the exemplary embodiment, the system requirements for such configuration or reconfiguration are included within the silverware module or configuration information, for use by the matrix (KARC) 150A in performing this evaluative function. If the configuration or reconfiguration may occur without such adverse affects, the silverware module is allowed to load into the matrices 150 (of memory 140), with the matrix (KARC) 150A setting up the DMA engines within the matrices 150C and 150D of the memory 140 (or other stand-alone DMA engines of a conventional memory). If the configuration or reconfiguration would or may have such adverse affects, the matrix (KARC) 150A does not allow the new module to be incorporated within the ACE 100.

Continuing to refer to FIG. 1, the matrix (MARC) 150B manages the scheduling of matrix 150 resources, clocking, and the timing of any corresponding data, to synchronize any configuration or reconfiguration of the various computational elements 250 and computation units 200 with any corresponding input data and output data. In the exemplary embodiment, timing or other clocking information is also included within a silverware module or, more generally, within configuration information, to allow the matrix (MARC) 150B through the various interconnection networks to direct a reconfiguration of the various matrices 150 in time, and preferably just in time, for the reconfiguration to occur before corresponding data has appeared at any inputs of the various reconfigured computation units 200. In addition, the matrix (MARC) 150B may also perform any residual processing which has not been accelerated within any of the various matrices 150. As a consequence, the matrix (MARC) 150B may be viewed as a control unit which "calls" the configurations and reconfigurations of the matrices 150, computation units 200 and computational elements 250, in real-time, in synchronization with any corresponding data to be utilized by these various reconfigurable hardware units, and which performs any residual or other control processing. Other matrices 150 may also include this control functionality, with any given matrix 150 capable of calling and controlling a configuration and reconfiguration of other matrices 150.

FIG. 2 is a block diagram illustrating, in greater detail, a reconfigurable matrix 150 with a plurality of computation units 200 (illustrated as computation units 200A through 200N), and a plurality of computational elements 250 (illustrated as computational elements 250A through 250Z), and provides additional illustration of the exemplary types of computational elements 250. As illustrated in FIG. 2, any matrix 150 generally includes a matrix controller 230, a plurality of computation (or computational) units 200, and as logical or conceptual subsets or portions of the matrix interconnect network 110, a data interconnect network 240 and a Boolean interconnect network 210. As mentioned above, in the exemplary embodiment, at increasing "depths" within the ACE 100 architecture, the interconnect networks become increasingly rich, for greater levels of adaptability and reconfiguration. The Boolean interconnect network 210, also as mentioned above, provides, the reconfiguration and data interconnection capability between and among the various computation units 200, and is preferably small (i.e., only a few bits wide), while the data interconnect network 240 provides the reconfiguration and data interconnection capability for data input and output between and among the various computation units 200, and is preferably comparatively large (i.e., many bits wide). It should be noted, however, that while conceptually divided into reconfiguration and data capabilities, any given physical portion of the matrix interconnection network 110, at any given time, may be operating as either the Boolean interconnect network 210, the data interconnect network 240, the lower level interconnect 220 (between and among the various computational elements 250), or other input, output, configuration, or connection functionality.

Continuing to refer to FIG. 2, included within a computation unit 200 are a plurality of computational elements 250, illustrated as computational elements 250A through 250Z (individually and collectively referred to as computational elements 250), and additional interconnect 220. The interconnect 220 provides the reconfigurable interconnection capability and input/output paths between and among the various computational elements 250. As indicated above, each of the various computational elements 250 consist of dedicated, application specific hardware designed to perform a given task or range of tasks, resulting in a plurality of different, fixed computational elements 250. Utilizing the interconnect 220, the fixed computational elements 250 may be reconfigurably connected together into adaptive and varied computational units 200, which also may be further reconfigured and interconnected, to execute an algorithm or other function, at any given time, utilizing the interconnect 220, the Boolean network 210, and the matrix interconnection network 110. While illustrated with effectively two levels of interconnect (for configuring computational elements 250 into computational units 200, and in turn, into matrices 150), for ease of explanation, it should be understood that the interconnect, and corresponding configuration, may extend to many additional levels within the ACE 100. For example, utilizing a tree concept, with the fixed computational elements analogous to leaves, a plurality of levels of interconnection and adaptation are available, analogous to twigs, branches, boughs, limbs, trunks, and so on, without limitation.

In the exemplary embodiment, the various computational elements 250 are designed and grouped together, into the various adaptive and reconfigurable computation units 200. In addition to computational elements 250 which are designed to execute a particular algorithm or function, such as multiplication, correlation, clocking, synchronization, queuing, sampling, or addition, other types of computational elements 250 are also utilized in the exemplary embodiment. As illustrated in FIG. 2, computational elements 250A and 250B implement memory, to provide local memory elements for any given calculation or processing function (compared to the more "remote" memory 140). In addition, computational elements 2501, 250J, 250K and 250L are configured to implement finite state machines, to provide local processing capability (compared to the more "remote" matrix (MARC) 150B), especially suitable for complicated control processing.

With the various types of different computational elements 250 which may be available, depending upon the desired functionality of the ACE 100, the computation units 200 may be loosely categorized. A first category of computation units 200 includes computational elements 250 performing linear operations, such as multiplication, addition, finite impulse response filtering, clocking, synchronization, and so on. A second category of computation units 200 includes computational elements 250 performing non-linear operations, such as discrete cosine transformation, trigonometric calculations, and complex multiplications. A third type of computation unit 200 implements a finite state machine, such as computation unit 200C as illustrated in FIG. 2, particularly useful for complicated control sequences, dynamic scheduling, and input/output management, while a fourth type may implement memory and memory management, such as within computation unit 200A. A fifth type of computation unit 200 may be included to perform bit-level manipulation, such as for encryption, decryption, channel coding, Viterbi decoding, and packet and protocol processing (such as Internet Protocol processing). In addition, another (sixth) type of computation unit 200 may be utilized to extend or continue any of these concepts, such as bit-level manipulation or finite state machine manipulations, to increasingly lower levels within the ACE 100 architecture.

In the exemplary embodiment, in addition to control from other matrices or nodes 150, a matrix controller 230 may also be included or distributed within any given matrix 150, also to provide greater locality of reference and control of any reconfiguration processes and any corresponding data manipulations. For example, once a reconfiguration of computational elements 250 has occurred within any given computation unit 200, the matrix controller 230 may direct that that particular instantiation (or configuration) remain intact for a certain period of time to, for example, continue repetitive data processing for a given application.

As may be apparent from the discussion above, the design of an adaptive computing circuit, such as an ACE 100 circuit, including determining the type, number, placement, and MIN routing of or for computational units 200 and computational elements 250, for subsequent fabrication into an integrated circuit, may be a daunting task. Similarly, how such computational units 200 and computational elements 250 are to be configured and reconfigured to perform a given task must also be determined. In accordance with the present invention, these two sets of tasks occur approximately jointly and interactively, optimizing the adaptive computing IC for a plurality of functions and operating modes. In addition, the present invention enables further IC optimization for speed, size, utilization factors, and power consumption, with additional emphasis on enabling concurrent or parallel computing across multiple computational units 200 and computational elements 250. (It should be noted that optimization is used herein in a very broad sense, to mean and include merely desired or acceptable for one or more purposes, for example, and not just meaning "most" desired or favorable.)

Figure 3:
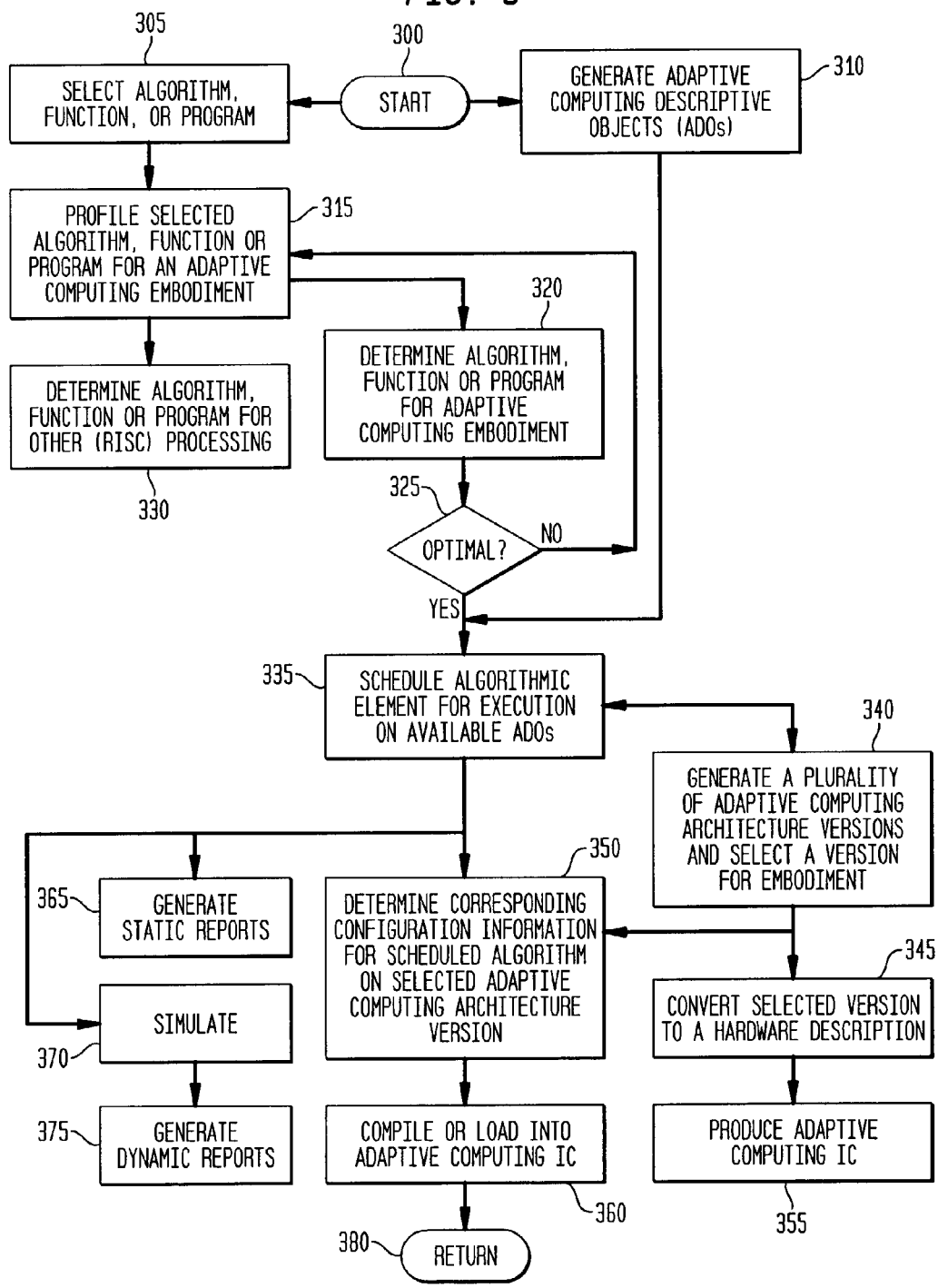
FIG. 3 is a flow diagram illustrating an exemplary method embodiment in accordance with the present invention.
Figure 4:
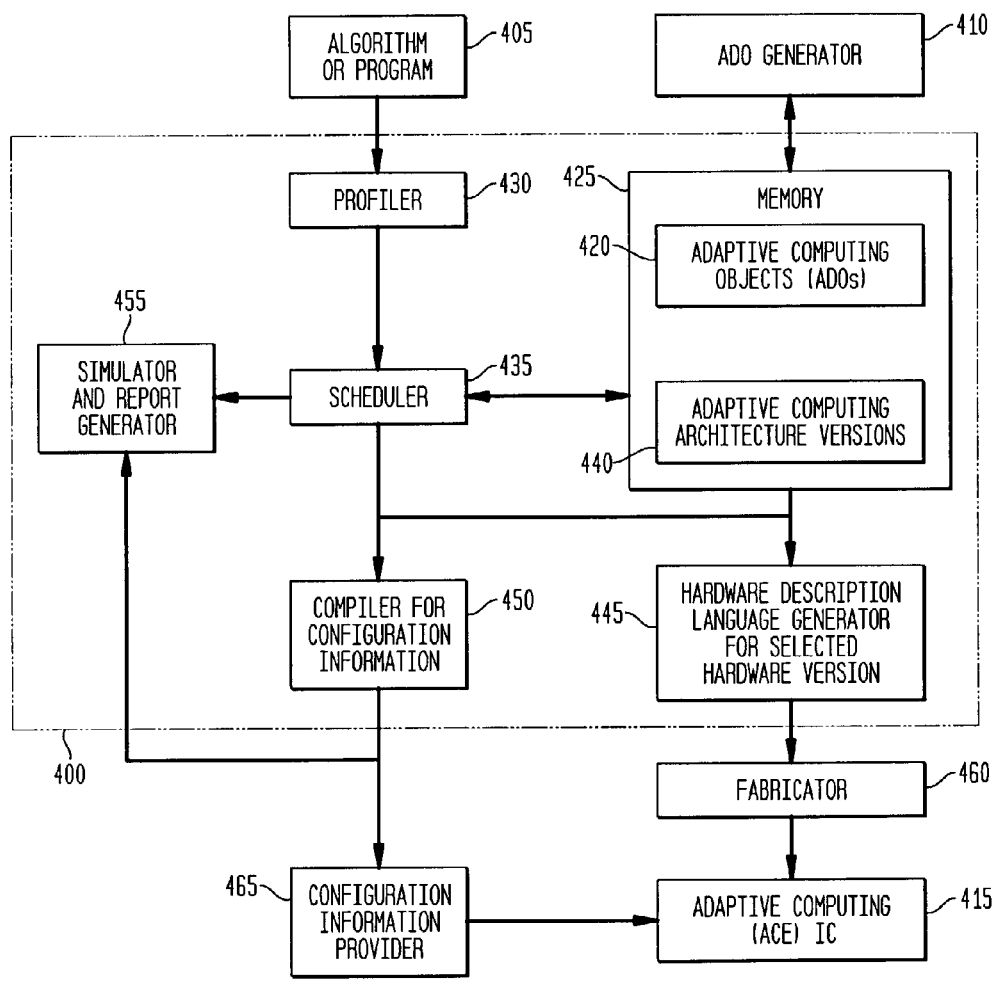
FIG. 4 is a block diagram illustrating an exemplary system embodiment in accordance with the present invention.

FIG. 3 is a flow diagram illustrating an exemplary method embodiment, for developing and scheduling both adaptive integrated circuitry having fixed, application specific computational elements and corresponding control or configuration information, in accordance with the present invention. Beginning with a start step 300, the exemplary method proceeds along two separate, and initially independent, paths, with the first path being focused upon the desired or selected algorithms, functions or programs for execution (steps 305, 315-325), and the second path being focused upon the development of the hardware (or IC) aspects of the adaptive computing integrated circuit (steps 310 and 340). The end result of this process, as discussed in greater detail below, will be an adaptive computing circuit design and corresponding configuration information (as a bit file or sequence) to control the adaptive computing circuit and allow it to execute its selected operating mode.

As a consequence, the method proceeds to step 305, to select or generate the desired algorithm, function or program. Preferably jointly, the method also proceeds to generate one or more descriptions of a plurality of computational elements 250 and computational units 200, step 310, preferably as hardware descriptions, to form "objects" referred to as adaptive computing (or ACE) descriptive objects ("ADOs") in the exemplary embodiment, and which preferably function as "objects" within the method of the invention, as objects are generally defined and used in object oriented programming languages and systems.

In the exemplary embodiment, the algorithm, function or program selection or generation step 305 is conducted using a comparatively high-level language, such as the C or C++ programming languages, or the "Q" language which is the subject of a related patent application. For example, a given algorithm or function may be programmed in C, C++ or Q. Alternatively, there may be existing C or C++ programs, and even engineering standards expressed in C or C++, which are or have been selected for execution on an ACE 100 or other adaptive computing circuit. Such programs or code, especially legacy code designed for execution on a processor, are not necessarily optimized for execution on an ACE 100 or other adaptive computing circuit. As a consequence, the selected programs or algorithms of step 305 are then profiled and optimized for comparatively optimal execution an ACE 100 or other adaptive computing circuit in step 315. For selected programs or algorithms of step 305 which have already been designed or developed for an adaptive computing circuit such as the ACE 100, the method may proceed directly to step 335 (bypassing the profiling and other intervening steps 315, 320, 325 and 330).

The profiling of step 315 analyzes the program code or other algorithm based upon a plurality of data parameters (or data metrics), with identification of the corresponding algorithmic element. While profiling on the basis of data parameters is the subject of another related patent application, the plurality of data parameters may comprise one or more of the following parameters, in addition to other forms of data measurement:

data location (for static data), such as a memory or register location;

data type, such as input data, intermediate calculation data, output data, other forms of operand data, and so on;

data size (input and output), such as number of bits, bandwidth required (bus or interconnect width), which may also be a function of or otherwise related to data type;

data source and destination locations (for dynamic data), such as memory or register locations;

data pipeline length, such as how long a data stream is;

locality of reference, such as how far the data is from the computing elements which will process or use it;

distance of data movement (for dynamic data), such as a distance between various caches, registers, or other memory locations, and/or the distance the data moves between or among the lines of code being profiled;

speed of data movement (for dynamic data), namely, how fast was the data able to be moved from a source location to a computing element and/or to a destination location, such as the number of computation cycles utilized in the data transfer;

data access frequency, such as how often was the data accessed;

data loads and stores (load/stores) into registers, caches or other memory;

degree of cache, register or memory usage; and data persistence, such as how long did the data remain in use, either unchanged or as (repeatedly) modified and used.

Based upon the results of profiling using the data parameters (i.e., profiled data parameter results or measured data parameters), portions of the profiled code are selected for execution on the adaptive computing architecture, step 320. The profiling statistics are calculated iteratively in the exemplary embodiment, as portions of code are identified as capable of acceleration in the ACE hardware, and subsequently removed from the program code. The profiling process is repeated until optimal performance of the configuration and the ACE architecture is achieved, step 325. Those of skill in the art will realize that this iterative profiling process may also be expressed through one or more other conditional statements or expressions. In addition, those of skill in the art will also recognize that other forms of profiling may also be utilized, in lieu of or in addition to the exemplary data profiling of the present invention, and are within the scope of the present invention.

In the exemplary embodiment, data parameters for the profiling of step 315 include one or more of the following attributes, as mentioned above: data location (for static data), data type, data size (input and output), data source and destination locations (for dynamic data), data pipeline length, locality of reference, distance of data movement, speed of data movement, data access frequency, number of data load/stores, degree of cache, register or memory usage, and data persistence.

In the exemplary embodiment, all of the algorithm or program is ultimately selected for execution in the adaptive computing circuit, such as the ACE 100. In other embodiments, however, portions of the algorithm or program which may not be selected for execution in the ACE 100 in step 320 may be selected for execution in a processor, such as a RISC processor, step 330, when such a processor is available or desirable in the selected embodiment.

Following step 305 or step 325, the algorithms, functions or programs for execution on an adaptive computing circuit, such as the ACE 100, are then "scheduled" in step 335, as discussed in greater detail below.

Independently of steps 305 and 315 through 330, the "hardware" descriptions are generated in step 310, preferably as adaptive computing (ACE) descriptive objects (ADOs). Step 310 may occur at any time, such as before, concurrently with or subsequent to steps 305 and 315 through 330. In the exemplary embodiment, a plurality of adaptive computing descriptive objects are defined and generated using a comparatively high-level language such as Java, and are stored in a library or other database for subsequent use in the method, such as in steps 335, 340 and 345, discussed below. Such adaptive computing descriptive objects, for example, may describe an adder, its inputs and outputs, a register file and its inputs and outputs, and how the adder and register file are to be connected to each other. Such ADOs are generated for every type of computational element, and the number of such ADOs is generally only limited by the number of matrices 150 which are to be available in the IC. In general, an adaptive computing descriptive object should include a description of the desired function (such as addition or multiplication), with description of its inputs and outputs, such as 16 or 32 bit I/O; in the exemplary embodiment, an ADO further includes a description of memory resources for operand and result data (such as a register file) and its I/O, and desired connections between the desired function and corresponding memory resources. In the exemplary embodiment, step 310 is implemented through a descriptive object "creator" process, which may convert higher-level descriptions into adaptive computing descriptive objects.

The adaptive computing descriptive objects may then be selected and combined into various groups or sets to perform various functions or algorithms; in the exemplary embodiment, this selecting and combining is performed during the scheduling process of step 335, as discussed in greater detail below. This scheduling process is also discussed in greater detail in the second related application. The various combinations of these adaptive computing descriptive objects which are selected, ultimately then form or comprise corresponding, multiple versions of adaptive computing circuitry, for use in steps 335 and 340. These adaptive computing circuit versions will vary depending upon the selected operating modes of the ACE 100 and the algorithms or functions the adaptive computing circuit is to perform. As discussed in greater detail below, these adaptive computing circuit versions may also differ according to their operational feature set, or optimization for various goals, such as comparatively low power consumption, comparatively low latency, bandwidth, comparatively high speed, and versatility for performance of a plurality of operating modes or algorithms. In the exemplary embodiment, an adaptive computing circuit version is generated through an iterative scheduling process (of step 335), which selects one or more ADOs for the performance of an algorithmic or functional element, maps the algorithmic elements to corresponding adaptive computing descriptive objects for execution, and provides corresponding timing information for execution of the algorithmic element on the selected hardware, as discussed in greater detail below.

As indicated above, the scheduling process of step 335 (also referred to and embodied as a "scheduler" of FIG. 4) receives, as input, a series of algorithmic or functional elements from the selected algorithm or program (from step 305 or from steps 320 and 325), which are to be performed on an adaptive computing circuit. The scheduling process of step 335 also receives, as input, the library (or database) of adaptive computing descriptive objects (from step 310). The scheduling process (of step 335) then matches or maps an algorithmic or functional element to an adaptive computing descriptive object, for execution (when the ADO is converted to an IC), generating multiple adaptive computing circuit versions (step 340). For example, the scheduling process may map a 32-bit add in an algorithm to two 16-bit adders (as described as ADOs), with corresponding MIN 110 connections, for simultaneous execution. In another iteration, to optimize the ACE 100, the scheduling process may map a 64-bit add in an algorithm to four 16-bit adders (as described as ADOs), with corresponding MIN 110 connections, also for simultaneous performance. In addition, the exemplary scheduler is designed to recognize when various algorithms may be executed in parallel, rather than sequentially, and allocate ADOs accordingly. This scheduling process continues in an iterative fashion (illustrated with a double arrow notation between steps 335 and 340 in FIG. 3), matching algorithmic elements to available ADOs in the various different (and potentially changing) adaptive computing circuit versions. It should be noted, more specifically, that during these iterations, using available ADOs, multiple and different ACE circuit version may be generated in the scheduling process, producing a plurality of adaptive computing circuit versions, step 340, which may be optimized or adapted for different IC goals, such as high speed or minimizing power consumption.

One of the aims of the scheduling process of step 335 is to achieve a one-to-one correspondence between each algorithmic element and a computational element 250 needed to execute the algorithmic element. Furthermore, algorithmic elements may be scheduled with ADOs to reduce power consumption and/or latency, or to reduce bandwidth required for data movement across processes. The scheduler is also designed to recognize potentially competing resources, and to iteratively optimize the performance of the algorithm or program on a potential ACE circuit version, utilizing the plurality of ACE circuit versions which have been iteratively generated and which are thereby available, ultimately selecting one ACE circuit (or hardware) version as optimal or acceptable in light of the selected algorithms, available resources, competing operating modes, versatility, power consumption, latency, bandwidth, speed of operation, and the other considerations mentioned above, step 340. As a consequence, the scheduler of step 335 coordinates available adaptive computing (hardware) resources, over time, with the processes to be performed for the selected operating mode, generating the selected adaptive computing circuit version, with a corresponding scheduled algorithm or program for performance of the desired operating mode of the adaptive computing circuit.

In the exemplary embodiment, information is also output from the scheduling process and may be utilized to generate static reports, step 365, such as resource utilization reports (e.g., number and type of computational elements 250), and may be run through a simulation process (step 370), generating a dynamic report, such as describing power utilization, speed, bandwidth, and so on, step 375. These various reports may be used, for example, for evaluation purposes, and additional input may be provided back into the scheduler of step 335 to further optimize the adaptive computing circuit.

Once the scheduling process (or the various reports) indicate no comparatively greater opportunity or need for optimization of the selected circuit version (of step 340), the selected adaptive computing circuit version is converted into a hardware description, step 345, using a hardware description language as known in the field (such as Verilog), and ultimately fabricated to produce an ACE 100 or other adaptive computing integrated circuit corresponding to the selected circuit version, step 355.

The scheduling process of step 335 also provides an output indicating which computational elements 250 are in use in the adaptive computing circuit (such as the ACE 100), when, and how they are connected, i.e., an output of a scheduled algorithm or program for providing an operating mode to the selected adaptive computing circuit. This information is then compiled (converted or assembled) in step 350 into configuration information corresponding to the algorithmic element as scheduled for execution on selected computational elements 250. In the exemplary embodiment, the configuration information is an adaptive computing circuit (ACE) bit file, such as a stream or packet of bits which indicate, throughout the entire adaptive computing (ACE 100) circuit, the state (such as an initial state and any state changes) of various multiplexers, demultiplexers, or switches, which turn on or off different paths of interconnect (MIN), for connecting and reconnecting various computational elements, for routing of operand data and results, and for routing of configuration information within the IC. The resulting configuration information may then be compiled and/or loaded into one or more fabricated adaptive computing circuits, step 360, and the process may end, return step 380.

There are particularly novel features of the method illustrated in FIG. 3. First, the method provides control over the entire process of adaptive computing circuit development, from algorithm to loading a configuration bit file into an ACE 100.

Second, the method enables the creation of multiple versions of configuration information, for a selected operating mode, corresponding to either different hardware versions (used in step 340 to select an optimal version), or a different (operational) feature set of an ACE 100 circuit. For example, suppose three separate adaptive computing circuit versions are fabricated, hardware version 1, hardware version 2, and hardware version 3, each with different computational capabilities. The various adaptive computing circuit versions may have been optimized for different goals such as, for example, minimizing power consumption, maximizing speed of operation, minimizing cost, minimizing latency, maximizing versatility for having multiple operating modes, and so on. Each version, however, at a minimum will have a CDMA mobile communications operating mode, for this example. As a consequence, the scheduling and compiling of configuration information (of, respectively, steps 335 and 350) may generate corresponding sets of configuration information, enabling each hardware version to have the corresponding operating mode, with potentially differing operational feature sets (or more simply, feature sets), for the hardware version's given capabilities. Different feature sets (for an operating mode such as CDMA mobile communications) may include, for example, different memory and dialing list capability, different automatic dialing options, different alerting (ringing) options, different data transmission capabilities, and any other similar capabilities, such as feature sets for other potential operating modes such as paging, message display, electronic mail (email), or internet access capability. (It should be noted that depending upon the degree of convergence of multiple technologies, distinctions between an operating mode and a feature set may easily be blurred; for example, a CDMA mobile station may also include a paging function as part of its feature set, which would otherwise be an operating mode in a stand-alone pager.)

Continuing with the example, each of these hardware versions may then acquire additional operating modes, and have different capabilities or versatility for having additional operating modes. For example, hardware version 1 may also be capable of and select a GSM mobile communications operating mode and MP3 music playing capacity, while hardware versions 2 and 3 may be capable of only an additional MP3 music playing operating mode (given the now pre-existing CDMA operating mode). Multiple variations are clearly possible, especially given that new operating modes may be acquired, with or without retention of previous or pre-existing operating modes. Again, in light of the capabilities of each hardware version and its other operating modes (as competing for the same resources), the scheduling and compiling of configuration information steps 335 and 350 may generate corresponding sets or versions of configuration information, enabling each hardware version to have the corresponding operating mode, such as GSM or MP3, also with potentially differing feature sets, and also for the hardware version's given capabilities.

Third, and especially useful, an entire library or database of these versions of configuration information may be created in advance or in real time, based upon any one or more of a plurality of selection parameters, such as for each desired operating mode, for each hardware version, for each selected feature set, and in light of pre-existing or competing operating modes. In addition, additional versions may also be created for different operating conditions, such as power consumption, latency, and bandwidth considerations. A library of such versions (as "multiple binaries") may be stored in multiple locations, such as on a network server, in a base station transceiver, or in another intelligent network device (such as an intelligent peripheral, a service circuit node, and so on), for download into a given ACE 100 by a corresponding service provider.

Fourth, all of the various processes may run off a single set of descriptions, the adaptive computing descriptive objects (or ADOs), for any number of different operating modes, with corresponding algorithms bound to the hardware through the scheduling process.

Fifth, the process is dynamic, with selected changes available when the configuration information is compiled or assembled into a corresponding bit file for loading into the ACE 100.

An exemplary system embodiment 400 in accordance with the present invention is illustrated in FIG. 4, and also provides a useful summary. Preferably, the system 400 is embodied as or included within one or more computers, engineering workstations, servers, a collection of networked computers, or other computing devices, with some or all of the various processes of the method of the invention (discussed above) embodied or included as programs, code or configuration information, for execution therein, or included equivalently, such as "hard wired" in an ASIC. The invention may be embodied as any type of software (e.g., for use in a system 400), such as C, C++, C#, Java, or any other type of programming language, including embodiment as configuration information (as a form of software) to direct a configuration within an adaptive computing architecture to perform the various development functions of the invention. The invention may be embodied within any tangible storage medium, such as within a memory or storage device for use by a computer, a workstation, any other machine-readable medium or form, or any other storage form or medium for use in a computing system to develop adaptive computing circuitry and corresponding configuration information. Such storage medium, memory or other storage devices may be any type of memory device, memory integrated circuit ("IC"), or memory portion of an integrated circuit (such as the resident memory within a processor IC or ACE 100), including without limitation RAM, FLASH, DRAM, SRAM, SDRAM, MRAM, FeRAM, ROM, EPROM or $E^2$PROM, or any other type of memory, storage medium, or data storage apparatus or circuit, depending upon the selected embodiment. For example, without limitation, a tangible medium storing computer or machine readable software, or other machine-readable medium, is interpreted broadly and may include a floppy disk, a CDROM, a CD-RW, a magnetic hard drive, an optical drive, a quantum computing storage medium or device, a transmitted electromagnetic signal (e.g., a computer data signal embodied in a carrier wave used in internet downloading), or any other type of data storage apparatus or medium, and may have a static embodiment (such as in a memory or storage device) or may have a dynamic embodiment (such as a transmitted electrical signal), or their equivalents.

Referring to FIG. 4, the system 400, in general, receives input of an algorithm or program (405) for modification in accordance with the invention for use on an adaptive computing circuit 415, and input of adaptive computing descriptive objects (ADOs) 420 from an adaptive computing descriptive object generator 410. Alternatively, the adaptive computing descriptive objects generator 410 may also be included within the system 400, and for such an embodiment, the received input is generally a set of IC specifications, such as a specification of the number of matrices, a maximum number of types of computation elements, and any other limitations to be imposed on the resulting adaptive computing IC 415. The input or generated adaptive computing descriptive objects 420 are preferably stored in a memory 425, which may be any form of memory IC or information storage device, of any kind, as indicated above. The algorithm or program 405 is preferably input into a profiler 430, for profiling as discussed above; depending upon the type of algorithm or program 405 which is input, profiling may not be needed and, in such case, the algorithm or program 405 may be input directly into a scheduler 435.

Continuing to refer to FIG. 4, the scheduler 435, in turn, as discussed above (step 335), schedules the algorithm or program 405 with the adaptive computing descriptive objects 420, to iteratively produce and optimize the adaptive computing architecture versions 440, which are also stored in memory 425. When an optimal adaptive computing architecture version has been achieved, with the corresponding scheduled algorithm or program, the scheduler 435 outputs this information to simulator and report generator 455, configuration information compiler 450, and the hardware description language generator 445. The configuration information compiler 450 produces the configuration information, as an adaptive computing circuit (ACE) bit file, corresponding to the scheduled algorithm, for the selected, preferably optimized, adaptive computing architecture version, as discussed above. The hardware description language generator 445 produces a hardware language description of the selected adaptive computing architecture version, while the simulator and report generator 455 simulates, and generates corresponding reports for, the selected adaptive computing architecture version as it is run with the compiled configuration information. The hardware language description of the selected adaptive computing architecture version may then be provided to a fabricator 460 for production of the corresponding adaptive computing IC 415 (such as an ACE 100). The compiled configuration information may be provided to one or more service providers, such as configuration information provider 465, for ultimate loading into the adaptive computing IC 415.

Numerous advantages of the present invention are readily apparent. The invention provides control over the entire design and development process, from algorithm to loading a configuration bit file into an ACE 100. The invention enables the creation of multiple versions of configuration information for an adaptive computing circuit, for one or more selected operating modes, corresponding to different hardware versions, different feature sets, different operating conditions, and pre-existing operating modes. An entire library or database of these versions of configuration information may be created in advance or in real time, for each desired operating mode, for each hardware version, for each selected feature set, and in light of pre-existing or competing operating modes. In addition, additional versions may also be created for different operating conditions, such as power consumption, latency, and bandwidth considerations. A library of such versions (as "multiple binaries") may be stored in multiple locations, such as on a network server, for download into a given adaptive computing circuit by a corresponding service provider. All of the various processes of the present invention may run off a single set of descriptions, the adaptive computing descriptive objects (or ADOs), for any number of different operating modes, with corresponding algorithms bound to the hardware through the scheduling process. Lastly, the process is dynamic, with selected changes available when the configuration information is compiled or assembled into a corresponding bit file for loading into the adaptive computing circuit.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

We claim:
1. A computer implemented method for development of configuration information for an adaptive computing integrated circuit that includes a plurality of heterogeneous computing elements, the plurality of heterogeneous computing elements adapted to being coupled to each other by a reconfigurable interconnection network, the configuration information configuring or reconfiguring the interconnection network to interconnect one or more of the plurality of the heterogeneous computing elements to perform at least a part of an algorithm, the method comprising:
   (a) selecting the algorithm for performance by the adaptive computing integrated circuit;
   (b) determining, using a computing system, a plurality of adaptive computing descriptive objects for functions of the selected algorithm;
   (c) scheduling, using the computing system, the selected algorithm with the plurality of adaptive computing descriptive objects to produce a scheduled algorithm; and
   (d) from the scheduled algorithm and the plurality of adaptive computing descriptive objects, generating, using the computing system, the configuration information for the performance of the algorithm by the adaptive computing integrated circuit, the configuration information used to configure or reconfigure the interconnection network to interconnect the one or more of the plurality of the heterogeneous computing elements to perform the at least part of the algorithm, each of the one or more of the plurality of the heterogeneous computing elements performing a corresponding computational task of the at least part of the algorithm.

2. The method of claim 1, further comprising:
converting the adaptive computing descriptive objects to a hardware description language file for use in the fabrication of a fixed architecture, computing integrated circuit.

3. The method of claim 1, further comprising selecting the adaptive computing integrated circuit by:
   generating, using the computing system, a plurality of adaptive computing circuit versions from the plurality of adaptive computing descriptive objects;
   scheduling, using the computing system, the algorithm with the plurality of adaptive computing descriptive objects of each of the plurality of adaptive computing circuit versions; and
   using a circuit version selection parameter of a plurality of circuit version selection parameters, selecting, using the computing system, an adaptive computing circuit version from the plurality of adaptive computing circuit versions, the selected adaptive computing circuit version corresponding to the selected adaptive computing integrated circuit.

4. The method of claim 3, wherein the plurality of circuit version selection parameters comprises at least two of the following circuit version selection parameters: power consumption, speed of operation, latency, bandwidth requirements, a competing operating mode, and versatility for a plurality of operating modes.

5. The method of claim 1, wherein step (a) further comprises:

profiling, using the computing system, the algorithm for performance on the one or more heterogeneous computing elements of the adaptive computing integrated circuit.

6. The method of claim 5, wherein the profiling is based upon a plurality of data parameters, the plurality of data parameters comprising at least two of the following parameters: data location for static data; data type, input data size; output data size; data source location; data destination location; data pipeline length; locality of reference; distance of data movement; speed of data movement; data access frequency; number of data load/stores; cache usage; register usage; memory usage, and data persistence.

7. The method of claim 1, further comprising:
compiling, using the computing system, the configuration information into an adaptive computing integrated circuit bit file.

8. The method of claim 7, further comprising:
loading, using the computing system, the adaptive computing integrated circuit bit file into the adaptive computing integrated circuit.

9. The method of claim 8, wherein the loading occurs from a location remote to the adaptive computing integrated circuit.

10. The method of claim 8, wherein the loading occurs as a download from a network.

11. The method of claim 1, further comprising:
generating, using the computing system, a plurality of configuration information versions, each configuration information version corresponding to a configuration information version selection parameter of a plurality of configuration information version selection parameters.

12. The method of claim 11, wherein the plurality of configuration information version selection parameters comprises at least two of the following configuration information version selection parameters: a competing operating mode, versatility for a plurality of operating modes, a selected operational feature set of a plurality of operational feature sets, selected operating conditions of a plurality of operation conditions, and a selected adaptive computing circuit version of a plurality of adaptive computing circuit versions.

13. The method of claim 1, further comprising:
compiling, using the computing system, the configuration information into a plurality of versions of adaptive computing integrated circuit bit files, each bit file version corresponding to a bit file version selection parameter of a plurality of bit file version selection parameters.

14. The method of claim 13, wherein the plurality of bit file version selection parameters comprises at least two of the following bit file version selection parameters: a competing operating mode, versatility for a plurality of operating modes, a selected operational feature set of a plurality of operational feature sets, selected operating conditions of a plurality of operating conditions, and a selected adaptive computing circuit version of a plurality of adaptive computing circuit versions.

15. The method of claim 1, wherein step (c) further comprises:
scheduling, using the computing system, the algorithm over time according to a one to one (1:1) correspondence between a plurality of algorithmic elements comprising the algorithm and the plurality of adaptive computing descriptive objects.

16. The method of claim 1, wherein step (c) further comprises:
generating, using the computing system, timing information within the configuration information, the timing information directing a configuration of the interconnection network to interconnect one or more heterogeneous computing elements of the adaptive computing integrated circuit prior to an arrival of corresponding operand data.

17. The method of claim 1, wherein each adaptive computing descriptive object of the plurality of adaptive computing descriptive objects comprises a description of a function in the scheduled algorithm to be performed by one or more of the heterogeneous computing elements, an input for the function, and an output for the function.

18. This method of claim 17, wherein each adaptive computing descriptive object of the plurality of adaptive computing descriptive objects further comprises a description of a memory resource for the function, an input for the memory resource, an output for the memory resource, and a connection between the function and the memory resource.

19. The method of claim 1, wherein, a selected adaptive computing descriptive object of the plurality of adaptive computing descriptive objects, describes a function of a plurality of functions, the plurality of functions comprising at least two of the following functions: a plurality of linear operations, a plurality of non-linear operations, a plurality of finite state machine operations, a plurality of control sequences, a plurality of bit level manipulations, memory, and memory management.

20. A computing system for development of configuration information for an adaptive computing integrated circuit having a plurality of heterogeneous computing elements, each of the plurality of heterogeneous computing elements coupled to a reconfigurable interconnection network, the configuration information for configuring or reconfiguring the interconnection network to interconnect one or more of the plurality of the heterogeneous computing elements to perform at least a part of a selected algorithm, the system comprising:
a computer with one or more processors;
a scheduler implemented in the computer, and adapted to schedule the selected algorithm with a plurality of adaptive computing descriptive objects to produce a scheduled algorithm;
a memory coupled to the scheduler, the memory storing the plurality of adaptive computing descriptive objects; and
a compiler implemented in the computer, and coupled to the scheduler, the compiler generating the configuration information, from the scheduled algorithm and the plurality of adaptive computing descriptive objects, the configuration information used to configure or reconfigure the interconnection network to interconnect the one or more of the plurality of the heterogeneous computing elements for the performance of the at least part of the algorithm, each of the one or more of the plurality of the heterogeneous computing elements performing a corresponding computational task of the at least part of the algorithm.

21. The system of claim 20, further comprising:
a hardware description generator implemented in the computer, and coupled to the scheduler, the hardware description generator converting the adaptive computing circuit descriptive objects to a hardware description language file for fabrication of a fixed architecture computing integrated circuit.

22. The system of claim 20, wherein the scheduler selects the adaptable computing integrated circuit by:
generating, using the computer, a plurality of adaptive computing circuit versions from the plurality of adaptive computing descriptive objects;

scheduling, using the computer, the algorithm with the plurality of adaptive computing descriptive objects of each of the plurality of adaptive computing circuit versions; and using a circuit version selection parameter of a plurality of circuit version selection parameters, selecting, using the computer, an adaptive computing circuit version from the plurality of adaptive computing circuit versions, to form the selected adaptive computing circuit version corresponding to the selected adaptive computing integrated circuit.

23. The system of claim 22, wherein the plurality of circuit version selection parameters comprises at least two of the following circuit version selection parameters power consumption, speed of operation, latency, bandwidth requirements, a competing operating mode, and versatility by a plurality of operating modes.

24. The system of claim 20, further comprising:
a profiler coupled to the scheduler, the profiler profiling, using the computer, the algorithm for performance on the adaptive computing integrated circuit.

25. The system of claim 24, wherein the profiling is based upon a plurality of data parameters, the plurality of data parameters comprising at least two of the following data parameters: data location for static data; data type; input data size; output data size; data source location; data destination location; data pipeline length; locality of reference; distance of data movement; speed of data movement; data access frequency; number of data load/stores, cache usage, register usage, memory usage, and data persistence.

26. The system of claim 24, wherein the profiler further profiling, using the computer, the algorithm for performance on the one or more processors.

27. The system of claim 20, wherein the compiler further compiling, using the computer, the configuration information into an adaptive computing integrated circuit bit file.

28. The system of claim 27, further comprising:
a configuration information provider, the configuration information provider loading, using the computer, the adaptive computing integrated circuit bit file into the adaptive computing integrated circuit.

29. The system of claim 28, wherein the loading occurs from a location remote to the adaptive computing integrated circuit.

30. The system of claim 28, wherein the loading occurs as a download from a network.

31. The system of claim 20, wherein the scheduler further generating, using the computer, a plurality of versions of configuration information, each configuration information version corresponding to a configuration information version selection parameter of a plurality of configuration information version selection parameters.

32. The system of claim 31, wherein the plurality of configuration information version selection parameters comprises at least two of the following configuration information version selection parameters: a competing operating mode, versatility for a plurality of operating modes, a selected operational feature set of a plurality of operational feature sets, selected operating conditions of a plurality of operating conditions; and a selected adaptive computing circuit version of a plurality of adaptive computing circuit versions.

33. The system of claim 20, wherein the compiler further compiling, using the computer, the configuration information into a plurality of versions of adaptive computing integrated circuit bit files, each bit file version corresponding to a bit file version selection parameter of a plurality of bit file version selection parameters.

34. The system of claim 33, wherein the plurality of bit file version selection parameters comprises at least two of the following bit file version selection parameters: a competing operation mode, versatility for a plurality of operating modes, a selected operational feature set of a plurality of operational feature sets, selected operating conditions of a plurality of operating conditions, and a selected adaptive computing circuit version of a plurality of adaptive computing circuit versions.

35. The system of claim 20, wherein the scheduler further scheduling, using the computer, the algorithm over time according to a one to one (1:1) correspondence between a plurality of algorithm elements comprising the algorithm and the plurality of adaptive computing descriptive objects.

36. The system of claim 20, wherein the scheduler further generating, using the computer, timing information within the configuration information, the timing information directing a configuration of interconnection network to interconnect at least one of the heterogeneous computing elements of the adaptive computing integrated circuit prior to an arrival of corresponding operand data.

37. The system of claim 20, wherein each adaptive computing descriptive object of the plurality of adaptive computing descriptive objects comprises a description of a function in the scheduled algorithm to be performed by one or more of the heterogeneous computing elements, an input for the function, and an output for the function.

38. The system of claim 37, wherein each adaptive computing descriptive object of the plurality of adaptive computing descriptive objects further comprises a description of a memory resource for the function, an input for the memory resource, an output for the memory resource, and a connection between the function and the memory resource.

39. The system of claim 20, wherein a selected adaptive computing descriptive object, of the plurality of adaptive computing descriptive objects, describes a function of a plurality of functions, the plurality of functions comprising at least two of the following functions a plurality of linear operations a plurality of non-linear operations, a plurality of finite state machine operations, a plurality of control sequences a plurality of bit level manipulations, memory, and memory management.

40. A storage medium storing machine executable software instructions which when executed on a computer develops configuration information for an adaptive computing integrated circuit having a plurality of heterogeneous computing elements, each of the plurality of heterogeneous computing elements adapted to being coupled to each other through a reconfigurable interconnection network, the configuration information for configuring or reconfiguring the interconnection network to interconnect one or more heterogeneous computing elements to perform at least a part of an algorithm, the medium storing instructions for:

selecting an algorithm for performance by the adaptive computing integrated circuit;

determining a plurality of adaptive computing descriptive objects for functions of the selected algorithm;

scheduling the selected algorithm with the plurality of adaptive computing descriptive objects to produce a scheduled algorithm; and generating the configuration information, from the scheduled algorithm and the adaptive computing descriptive objects, for the performance of at least a part of the algorithm by the one or more of the plurality of heterogeneous computing elements.

41. The medium of claim 40, further comprising instructions for:

converting the adaptive computing descriptive objects to a hardware description language file for fabrication to form a fixed architecture computing integrated circuit.

42. The medium of claim 40, further comprising instructions for:
generating a plurality of adaptive computing circuit versions from the plurality of adaptive computing descriptive objects; schedules the algorithm with the plurality of adaptive computing descriptive objects of each of the plurality of adaptive computing circuit versions; and selects an adaptive computing circuit version from the plurality of adaptive computing circuit versions, using a circuit version selection parameter of a plurality of circuit version selection parameters, to form a selected adaptive computing circuit version corresponding with the adaptive computing integrated circuit.

43. The medium of claim 42, wherein the plurality of circuit version selection parameters comprises at least two of the following circuit version selection parameters power consumption, speed of operation, latency, bandwidth requirements, a competing operating mode, and versatility for a plurality of operating modes.

44. The medium of claim 40, further comprising instructions for:
profiling the algorithm for performance on the adaptive computing integrated circuit.

45. The medium of claim 44, wherein the profiling is based upon a plurality of data parameters, the plurality of data parameters comprising at least two of the following data parameters: data location for static data; data type; input data size; output data size; data source location; data destination location, data pipeline length, locality of reference, distance of data movement, speed of data movement, data access frequency, number of data load/stores, cache usage; register usage; memory usage, and data persistence.

46. The medium of claim 40, further comprising instructions for:
profiling the algorithm for performance on one or more processors of the computer.

47. The medium of claim 40, further comprising instructions for:
compiling the configuration information into an adaptive computing integrated circuit bit file.

48. The medium of claim 47, further comprising instructions for:
loading the adaptive computing integrated circuit bit file into the adaptive computing integrated circuit.

49. The medium of claim 48, wherein the loading provides for loading occurring from a location remote to the adaptive computing integrated circuit.

50. The medium of claim 48, wherein the loading provides for loading occurring as a download from a network.

51. The medium of claim 40, further comprising instructions for:
generating a plurality of versions of configuration information, each configuration information version corresponding to a configuration information version selection parameter of a plurality of configuration information version selection parameters.

52. The medium of claim 51, wherein the plurality of configuration information version selection parameters comprises at least two of the following configuration information version selection parameters: a competing operating mode, versatility for a plurality of operating modes, a selected operational feature set of a plurality of operational feature sets, selected operating conditions of a plurality of operating conditions, and a selected adaptive computing circuit version of a plurality of adaptive computing circuit versions.

53. The medium of claim 40, further comprising instructions for:
compiling the configuration information into a plurality of versions of adaptive computing integrated circuit bit files, each bit file version corresponding to a bit file version selection parameter of a plurality of bit file version selection parameters.

54. The medium of claim 53, wherein the plurality of bit file version selection parameters comprises at least two of the following bit file version selection parameters: a competing operating mode, versatility for a plurality of operating modes, a selected operational feature set of a plurality of operational feature sets, selected operating conditions of plurality of operating conditions, and a selected adaptive computing circuit version of a plurality of adaptive computing circuit versions.

55. The medium of claim 40, further comprising instructions for:
scheduling the algorithm over time according to a one to one (1:1) correspondence between a plurality of algorithmic elements comprising the algorithm and the plurality of adaptive computing descriptive objects.

56. The medium of claim 40, further comprising instructions for:
generating timing information within the configuration information, the timing information directing a configuration of the adaptive computing integrated circuit prior to an arrival of corresponding operand data.

57. The medium of claim 40, wherein each adaptive computing descriptive object of the plurality of adaptive computing descriptive objects comprises a description of a function, an input for the function, and an output for the function.

58. The medium of claim 57, wherein each adaptive computing descriptive object of the plurality of adaptive computing descriptive objects further comprises a description of a memory resource for the function, an input for the memory resource, an output for the memory resource and a connection between the function and the memory resource.

59. The medium of claim 40, wherein a selected adaptive computing descriptive object, of the plurality of adaptive computing descriptive objects, describes a function of a plurality of functions, the plurality of functions comprising at least two of the following functions: a plurality of linear operations, a plurality of non-linear operations, a plurality of finite state machine operations, a plurality of control sequences, a plurality of bit level manipulations, memory, and memory management.

60. A computer implemented method for development of corresponding configuration information for an adaptive computing integrated circuit having a plurality of heterogeneous computing elements, each of which is adapted to being coupled to each other through a reconfigurable interconnection network, the configuration information configuring or reconfiguring the interconnection network to interconnect one or more of the plurality of the heterogeneous computing elements to perform at least a part of an algorithm, the method comprising
selecting the algorithm for performance by the adaptive computing integrated circuit;
profiling, using a computing system, the algorithm for performance on the adaptive computing integrated circuit;
determining, using the computing system, a plurality of adaptive computing descriptive objects, each adaptive computing descriptive object of the plurality of adaptive computing descriptive objects including a description of a function to be performed by one or more of the heterogeneous computing elements, an input for the function, and an output for the function;

scheduling, using the computing system, the algorithm with the plurality of adaptive computing descriptive objects; and from the selected scheduled algorithm generating, using the computing system, the configuration information and compiling the configuration information into an adaptive computing integrated circuit bit file for the performance of a corresponding computational task of the algorithm by one or more of the heterogeneous computing elements of the adaptive computing integrated circuit.

61. A computer implemented method for developing an adaptive computing integrated circuit to perform at least part of an algorithm, the adaptive computing integrated circuit including a plurality of heterogeneous computing elements being coupled to each other by a reconfigurable interconnection network, the method comprising:

determining, using a computing system, a plurality of adaptive computing descriptive objects associated with functions of the algorithm;

determining, using the computing system, a plurality of adaptive computing integrated circuit versions having a description of heterogeneous computing elements, each performing a function corresponding with at least one of the plurality of adaptive computing descriptive objects;

scheduling, using the computing system, the algorithm with the plurality of adaptive computing descriptive objects to produce a scheduled algorithm;

selecting, using the computing system, an adaptive computing integrated circuit version from the plurality of adaptive computing integrated circuit versions using a circuit version selection parameter of a plurality of circuit version selection parameters; and converting, using the computing system, the selected adaptive computing integrated circuit version to the adaptive computing integrated circuit.

62. The method of claim 61, further comprising converting, using the computing system, the selected adaptive computing circuit version to a hardware description language file for use in the fabrication of the adaptive computing integrated circuit.

63. The method of claim 61, wherein the plurality of circuit version selection parameters comprises at least two of the following circuit version selection parameters: power consumption, speed of operation, latency, bandwidth requirements, a competing operating mode, and versatility for a plurality of operating modes.

64. The method of claim 61, wherein step (a) further comprises:

profiling, using the computing system, the algorithm for performance on the one or more heterogeneous computing elements of the adaptive computing integrated circuit.

65. The method of claim 64, wherein the profiling is based upon a plurality of data parameters, the plurality of data parameters comprising at least two of the following parameters: data location for static data; data type, input data size; output data size; data source location; data destination location; data pipeline length; locality of reference; distance of data movement; speed of data movement; data access frequency; number of data load/stores; cache usage; register usage; memory usage, and data persistence.

66. The method of claim 61, further comprising determining, using the computing system, configuration information to configure the interconnection network of the adaptive computing integrated circuit to interconnect the heterogeneous computing elements to perform a function of the algorithm; and compiling the configuration information into an adaptive computing integrated circuit bit file.

67. The method of claim 66, further comprising generating, using the computing system, a plurality of configuration information versions, each configuration information version corresponding to a configuration information version selection parameter of a plurality of configuration information version selection parameters.

68. The method of claim 67, wherein the plurality of configuration information version selection parameters comprises at least two of the following configuration information version selection parameters: a competing operating mode, versatility for a plurality of operating modes, a selected operational feature set of a plurality of operational feature sets, selected operating conditions of a plurality of operation conditions, and a selected adaptive computing circuit version of a plurality of adaptive computing circuit versions.

69. The method of claim 61, wherein each adaptive computing descriptive object of the plurality of adaptive computing descriptive objects comprises a description of a function to be performed by one or more of the heterogeneous computing elements, an input for the function, and an output for the function.

70. The method of claim 69, wherein each adaptive computing descriptive object of the plurality of adaptive computing descriptive objects further comprises a description of a memory resource for the function, an input for the memory resource, an output for the memory resource, and a connection bet,ween the function and the memory resource.

71. The method of claim 61, wherein, a selected adaptive computing descriptive object of the plurality of adaptive computing descriptive objects, describes a function of a plurality of functions, the plurality of functions comprising at least two of the following functions: a plurality of linear operations, a plurality of non-linear operations, a plurality of finite state machine operations, a plurality of control sequences, a plurality of bit level manipulations, memory, and memory management.

* * * * *